US008446304B2

(12) United States Patent
Scanlan

(10) Patent No.: US 8,446,304 B2
(45) Date of Patent: May 21, 2013

(54) DIGITAL BACKGROUND CALIBRATION SYSTEM AND METHOD FOR SUCCESSIVE APPROXIMATION (SAR) ANALOGUE TO DIGITAL CONVERTER

(75) Inventor: Anthony Gerard Scanlan, Limerick (IE)

(73) Assignee: University of Limerick, Limerick (IE)

( * ) Notice: Subject to any disclaimer, the term of this patent is extended or adjusted under 35 U.S.C. 154(b) by 68 days.

(21) Appl. No.: 13/173,624

(22) Filed: Jun. 30, 2011

(65) Prior Publication Data

US 2012/0001781 A1  Jan. 5, 2012

(30) Foreign Application Priority Data

Jun. 30, 2010 (EP) .................................... 10168008
Feb. 23, 2011 (IE) .................................. S2011/0085

(51) Int. Cl.
*H03M 1/10* (2006.01)
(52) U.S. Cl.
USPC ........... 341/120; 341/144; 341/172; 341/156; 341/134; 341/121
(58) Field of Classification Search
USPC .................................. 341/120–155; 445/334
See application file for complete search history.

(56) References Cited

U.S. PATENT DOCUMENTS

| | | | |
|---|---|---|---|
| 7,035,756 B2* | 4/2006 | Maloberti et al. | ........... 702/126 |
| 7,084,804 B1* | 8/2006 | Engel | ............................ 341/162 |
| 7,107,175 B2* | 9/2006 | Maloberti et al. | ........... 702/126 |
| 7,187,310 B2* | 3/2007 | El-Sankary et al. | .......... 341/120 |
| 7,227,479 B1* | 6/2007 | Chen et al. | .................... 341/118 |
| 7,817,071 B2* | 10/2010 | Lin et al. | ........................ 341/120 |
| 7,825,837 B1* | 11/2010 | Khasnis et al. | ............... 341/120 |
| 8,031,092 B1* | 10/2011 | Sun | ............................... 341/120 |
| 8,169,350 B2* | 5/2012 | Oshima et al. | ................ 341/120 |

OTHER PUBLICATIONS

Baschirotto, "A Low-Voltage Sample-and-Hold Cicuit in Standard CMOS Technology Operating at 40 MS/s," IEEE Transacations on Circuits and Systems—II: Analog and Digital Signal Processing, 48(4):394-399, Apr. 2001.
Borghetti et al., "A Programmable 10b up-to-6MS/s SAR-ADC Featuring Constant-FoM with On-Chip Reference Voltage Buffers," 32$^{nd}$ European Solid-State Circuits Conference, 2006, pp. 500-503.
Chen et al., "Split Capacitor DAC Mismatch Calibration in Successive Approximation ADC," IEEE 2009 Custom Integrated Circuits Conference (CICC), pp. 279-282.
Grasso et al., "Reversed Double Pole-Zero Cancellation Frequency Compensation Technique for Three-Stage Amplifiers," Research in Microelectronics and Electronics, 2006, pp. 153-156.
Liu et al., "A 10-bit 50-MS/s SAR ADC With a Monotonic Capacitor Switching Procedure," IEEE Journal of Solid-State Circuits, 45(4):731-740, Apr. 2010.

(Continued)

*Primary Examiner* — Lam T Mai
(74) *Attorney, Agent, or Firm* — K&L Gates LLP

(57) ABSTRACT

The invention provides a digital background calibration system and method for a successive approximation analog-to-digital converter comprising a digital to analog converter (DAC) having a plurality of weighted capacitors to be calibrated; means for splitting each of said weighted capacitors into a plurality of sub-capacitors and at least one redundant capacitor; means for multiplying the voltage level of at least one of the sub-capacitors with a PN sequence; and means for calibrating the weighted capacitor from the multiplied sub-capacitor and the redundant capacitor.

16 Claims, 26 Drawing Sheets

OTHER PUBLICATIONS

Liu et al., "Background Digital Calibration of Successive Approximation ADC with Adaptive Equalisation," Electronics Letters, 45(9):456-458, Apr. 23, 2009.

Liu et al., "A 12b 22.5/45MS/s 3.0mW 0.059mm$^2$ CMOS SAR ADC Achieving Over 90dB SFDR," 2010 IEEE International Solid-State Circuits Conference, pp. 380-381.

Piessens et al., "A difference Reference Voltage Buffer for $\Delta\Sigma$-Converters," Analog Integrated Circuits and Signal Processing, (31):31-37, 2002.

Torelli et al., "Tracking Switched-Capacitor CMOS Current Reference," IEE Proc.-Circuits Devices Syst., 145(1):44-47, Feb. 1998.

Yong, "A 14-bit Successive-Approximation AD Converter with Digital Calibration Algorithm," ASIC, 2009; ASICON '09; IEEE 8$^{th}$ International Conference, pp. 234-237.

* cited by examiner $$q_1 \Delta_{1,k} + q_2 \Delta_{2,k} + ... q_n \Delta_{n,k}$$

Calibration Operation

Examples for 4 element + 1 redundant element (a)

(b)

| $px<15>$ | $\overline{px<13>}$ | S1 |
|---|---|---|
| 1 | 1 | 1 |
| 0 | 1 | 0 |
| 1 | 0 | 0 |
| 0 | 0 | 0 |

(c)

| $px<13>$ | $\overline{D_{i-1}}$ | S2 |
|---|---|---|
| 1 | 0 | 0 |
| 1 | 1 | 1 |
| 0 | 0 | 0 |
| 0 | 1 | 0 |

| $px<13>$ | $D_{i-1}$ | S3 |
|---|---|---|
| 1 | 1 | 1 |
| 1 | 0 | 1 |
| 0 | 1 | 0 |
| 0 | 0 | 0 |

(d)

DIGITAL BACKGROUND CALIBRATION SYSTEM AND METHOD FOR SUCCESSIVE APPROXIMATION (SAR) ANALOGUE TO DIGITAL CONVERTER

REFERENCE TO RELATED APPLICATIONS

This application claims priority to and the benefit of European Patent Application Number 10168008, filed on Jun. 30, 2010, and Irish Patent Application Number S2011/0085, filed on Feb. 23, 2011, the entire disclosures of each of which are hereby incorporated by reference herein.

FIELD OF THE INVENTION

The invention relates to a digital background calibration scheme for an Analog to Digital converter (ADC). In particular the invention relates to a calibration system and method specifically to enable high resolution SAR conversion on nanometer process technologies.

BACKGROUND TO THE INVENTION

Analog-to-Digital conversion remains an essential function for the latest systems on a chip designed in nanometer process technologies. The performance of analog circuits is difficult to maintain with reduced supply voltage and increased device mismatch. Furthermore system designers wish to achieve low power consumption and small area designs that can be readily scaled between technologies. The successive approximation (SAR) ADC is suitable for implementation in nanometer process technologies as it does not contain circuit elements that may not be fabricated in digital process technologies and is readily scalable. In order to achieve small area, low power consumption and small capacitive load, capacitors must be sized as small as possible. The lower limit of capacitor size is set by thermal noise considerations, but mismatch between capacitors will limit achievable resolution before the thermal noise limit is reached. In order to allow use of very small capacitors, calibration must be introduced into the ADC.

The principle of operation of this type of ADC is shown for a simple 4 bit capacitor based ADC in FIG. 1. The SAR converter comprises of the input sample and hold, a comparator, logic block and a digital to analog converter which in this case is capacitor based. Initially the input voltage to be converted $V_{IN}$, is sampled and held. The SAR logic connects the largest capacitor 8C to the reference voltage which changes the voltage at the negative terminal of the comparator by an amount directly proportional to the comparator size. This voltage is then compared against the held input voltage using the comparator. This result comprises the first MSB of the output digital word. Depending on the comparator decision the largest capacitor also is turned off (0) or remains on (1). The next largest capacitor 4C is then turned on and another comparison performed. In this manner the value of the $V_{IN}$ is approached iteratively at the negative terminal of the comparator and a digital word representing $V_{IN}$ is produced iteratively also.

The maximum achievable resolution of the SAR converter is dependent on the number of bits in the digital to analog converter. The practical limitation on the SAR resolution is dependent on the DAC i.e. the matching of the elements comprising the DAC. The purpose of the calibration schemes described in the prior art is to correct the elements of the DAC to improve the ADC resolution. There are numerous methods described in the art for calibrating SAR ADCs.

For example in a paper published by Liu, W.; Chiu, Y.; Background digital calibration of successive approximation ADC with adaptive equalisation Electronics Letters, Volume: 45, Issue: 9, 2009, Page(s): 456-458 a background Digital Calibration with adaptive equalisation is described. In this approach, as shown in FIG. 2 a slow-speed high-resolution reference ADC is placed in parallel with the SAR ADC that is to be calibrated. The reference ADC operates a factor M slower than the SAR ADC. The output of this ADC is therefore a very linear representation of the low frequency component of the input signal. The output of the SAR ADC is applied to a LMS adaptive filter. The output of this filter is controlled by the error between the decimated output of this filter and the output of the reference ADC. The effect of this feedback loop is to force the decimated output of the LMS filter to be equal to the reference ADC. Since the reference ADC output is linear the output of the LMS is also forced to be linear thereby producing a calibration. The problem with this approach is the requirement of a linear reference ADC and a large digital overhead.

In a paper published by He Yong; Wu Wuchen; Meng Hao; Zhou Zhonghua; A 14-bit successive-approximation AD converter with digital calibration algorithm ASIC, 2009. ASICON '09. IEEE 8th International Conference on 2009, Page(s): 234-237 a digital foreground calibration scheme is disclosed, as shown in FIG. 3. In this method the SAR algorithm itself is efficiently used for self-calibration. The capacitors representing the LSBs have a higher matching tolerance than the MSBs and may be sufficiently accurate to measure the relative error of the capacitors representing the MSBs. This approach stores the measured relative errors in a ROM and additional capacitors may be switched on in parallel with the MSBs in normal operating mode to provide a calibration. The disadvantage of this method is that it operates in foreground and required additional capacitors to effect calibration.

Another method is to use a Perturbation and Equalisation Approach, for example as disclosed in Wenbo Liu; Pingli Huang; Yun Chiu; A 12b 22.5/45MS/s 3.0 mW 0.059 mm$^2$ CMOS SAR ADC achieving over 90 dB SFDR. Solid-State Circuits Conference Digest of Technical Papers (ISSCC), 2010 IEEE International, Page(s): 380-381. In this approach a pseudo-random (PN) perturbation is applied in series with the input signal, as shown in FIG. 4. The addition or subtraction of the perturbation is controlled by a pseudo-random sequence. A second sample is obtained with the perturbation reversed. This creates two input samples which utilise different paths through the ADC. Similar to the techniques used above an equalisation method is used to force the error between the paths to zero. This has again the effect of calibrating the ADC. This approach saves on area by using paths rather than a separate ADC. Disadvantages include the need to sample the input signal twice thus halving speed and secondly the reduction on input range of adding the PN signal.

Another method uses a calibration for gain error in split array, as disclosed in a paper by Yanfei Chen; Xiaolei Zhu; Tamura, H.; Kibune, M.; Tomita, Y.; Hamada, T.; Yoshioka, M.; Ishikawa, K.; Takayama, T.; Ogawa, J.; Tsukamoto, S.; Kuroda, T.; Split capacitor DAC mismatch calibration in successive approximation ADC. Custom Integrated Circuits Conference, 2009. CICC '09. IEEE Publication Year: 2009, Page(s): 279-282. In the case where attenuation capacitors are utilised to reduce the overall input capacitance of the SAR ADC, gain errors are introduced between the portions of the array on either side of the attenuation capacitor. These gain errors arise due to systematic and random sizing errors of the attenuation capacitor and also due to parasitic capacitance. In order to calibrate this error an additional capacitor is added to the array and it may be trimmed in order to adjust the effective gain of the attenuation capacitor to eliminate errors. This process is performed in the foreground. FIG. 5 details the capacitor array, showing the attenuation capacitor and a trim capacitor.

Problems with Calibrated SAR ADC converters include addition of extra analog hardware, inability to compensate for gain error, addition of high speed logic and large power overhead.

There is therefore a need to provide a calibration system and method specifically to enable high resolution SAR conversion on nanometer process technologies to overcome the above mentioned problems.

SUMMARY OF THE INVENTION

According to the invention there is provided, as set out in the appended claims, a digital background calibration system for a successive approximation analog-to-digital converter comprising:
- a digital to analog converter (DAC) comprising a plurality of weighted capacitors to be calibrated;
- means for splitting each of said weighted capacitors into a plurality of sub-capacitors and at least one redundant capacitor;
- means for multiplying the voltage level at least one of the sub-capacitors with a PN sequence; and
- means for calibrating the weighted capacitor from the multiplied sub-capacitor and the redundant capacitor.

The invention presents a digital background calibration scheme for a successive approximation analog-to-digital converter ADC. Calibration schemes may be classified by their method of operation. If conversion is interrupted or calibration takes place during manufacture the calibration is considered to be a foreground scheme. If conversion can take place simultaneously with calibration it is considered to be a background calibration scheme. If calibration involves adjustment of analog elements of the converter such as trimming a capacitor the scheme is referred to as an analog calibration scheme. If the calibration scheme involves adjusting the output digital codes it is referred to as a digital calibration scheme. The system and method of the invention can be easily implemented in digital nanometer technology and is scalable between technologies, and provides the following advantages:
- Calibration scheme is primarily digital, only small amount of analog hardware required.
- Can compensate for gain error introduced by attenuation capacitors to reduce total input capacitive load and can perform this function digitally.
- Allows high speed operation as doesn't require additional logic on high speed path.
- Small Area/Power Overhead.
- Does not require two input samples thus preserving fast operating speed.

In one embodiment said means for calibrating produces output codes adapted to compensate for errors of the weighted capacitors.

In one embodiment the DAC comprises input from a PN generator circuit and a sub-capacitor selection circuit.

In one embodiment the PN generator module and the sub-capacitor selection module operate at a lower speed than the DAC.

In one embodiment at the start of each conversion cycle one of the sub-capacitors $\Delta_{i,k}$ is randomly selected from a signal obtained from the sub-capacitor selection circuit to be multiplied by the current value of the pseudo random sequence $q_{i,x}$ supplied from the PN generator circuit.

In one embodiment a voltage directly proportional to at least one weighted capacitor is added to an input voltage $V_{IN}$, and adapted to be converted to a digital value represented by $D(V_{IN}+q_{i,x}\cdot\Delta_{i,k})$.

In one embodiment the converted value is multiplied by the $q_{i,x}$ value to perform a correlation, and the output is adapted to be accumulated and averaged to obtain a DC value, represented by $D(\overline{\Delta_i})$.

In one embodiment there is provided means for subtracting the DC value from the expected value for the sub-capacitor $D(\Delta\exp_i)$ to provide an error value $\overline{\epsilon_i}$; and means for multiplying by the plurality of sub-capacitors to obtain the value used for calibration.

In one embodiment there is provided means for subtracting $D(\overline{\Delta_i})\cdot q_{i,x}$ from the converted signal $D(V_{IN}+q_{i,x}\cdot\Delta_{i,k})$ to remove a pertubation signal from the output signal allowing conversion to occur during calibration.

In one embodiment the DAC comprises at least one attenuation capacitor adapted to provide low values of capacitance during operation.

In one embodiment there is provided a trim capacitor adapted to compensate for gain error introduced by attenuation capacitor. Ideally the measured gain error determines the value of the trim capacitor and applied on the right hand side of the trim capacitor to adjust the gain error.

In one embodiment the system comprises means for increasing the capacitor size such that any perturbations can be allowed to occupy this additional range, with $2^N-1$ codes available for the input signal as required.

In one embodiment the system comprises means for forcing the calibration of each weighted capacitor to occur sequentially, or in a sequence of parallel combinations, such that the input range available for the signal is increased.

In one embodiment the system comprises means for increasing the number of segments each weighted capacitor is split up into such that the size of the perturbation signal is reduced.

In another embodiment of the present invention there is provided a method for digital background calibration of a successive approximation analog-to-digital converter comprising the steps of:
- arranging a digital to analog converter (DAC) having a plurality of weighted capacitors to be calibrated;
- splitting each of said weighted capacitors into a plurality of sub-capacitors and at least one redundant capacitor;
- multiplying the voltage level of at least one of the sub-capacitors with a PN sequence; and
- calibrating the weighted capacitor comprising said at least one sub-capacitor from said at least one sub-capacitor and said at least one redundant capacitor.

In one embodiment there is provided the step of calibrating produces output codes adapted to compensate for errors of the weighted capacitors.

There is also provided a computer program comprising program instructions for causing a computer program to carry out the above method which may be embodied on a record medium, carrier signal or read-only memory.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE DRAWINGS

Figure 1:
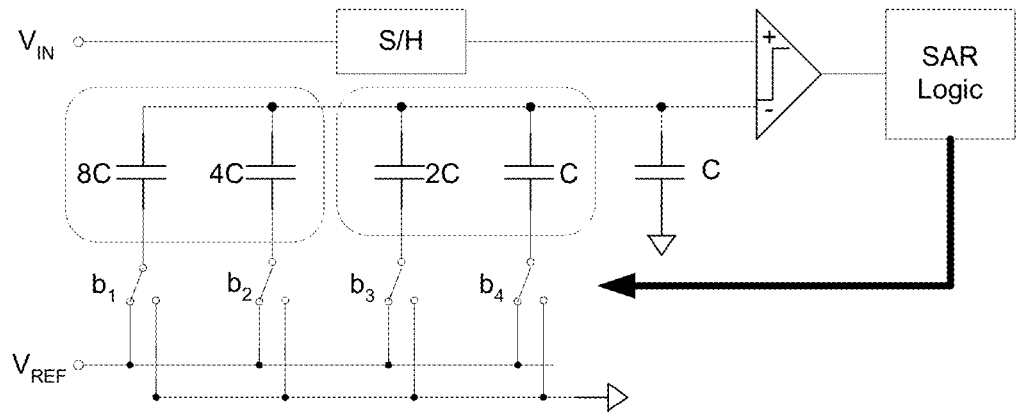
FIG. 1 illustrates principle of operation of a SAR ADC is shown for a simple 4 bit capacitor based.
Figure 2:
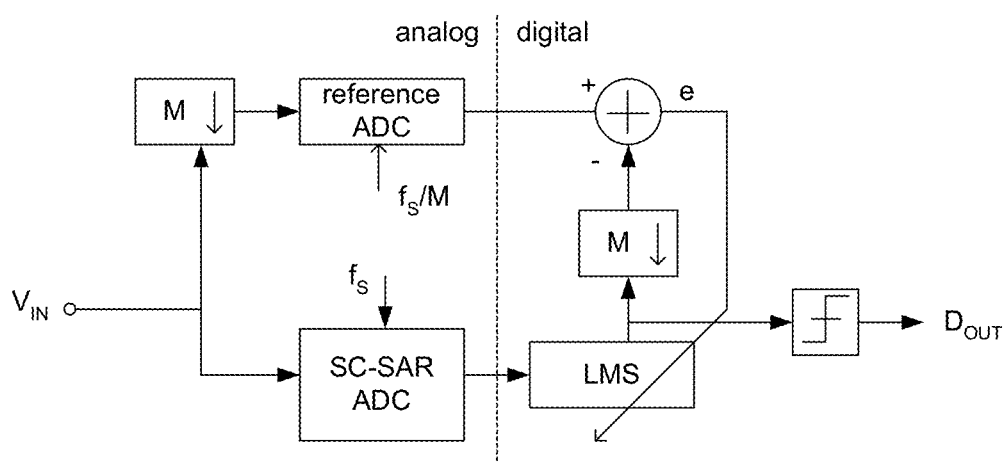
FIG. 2 illustrates a prior art digital calibration scheme.
Figure 3:
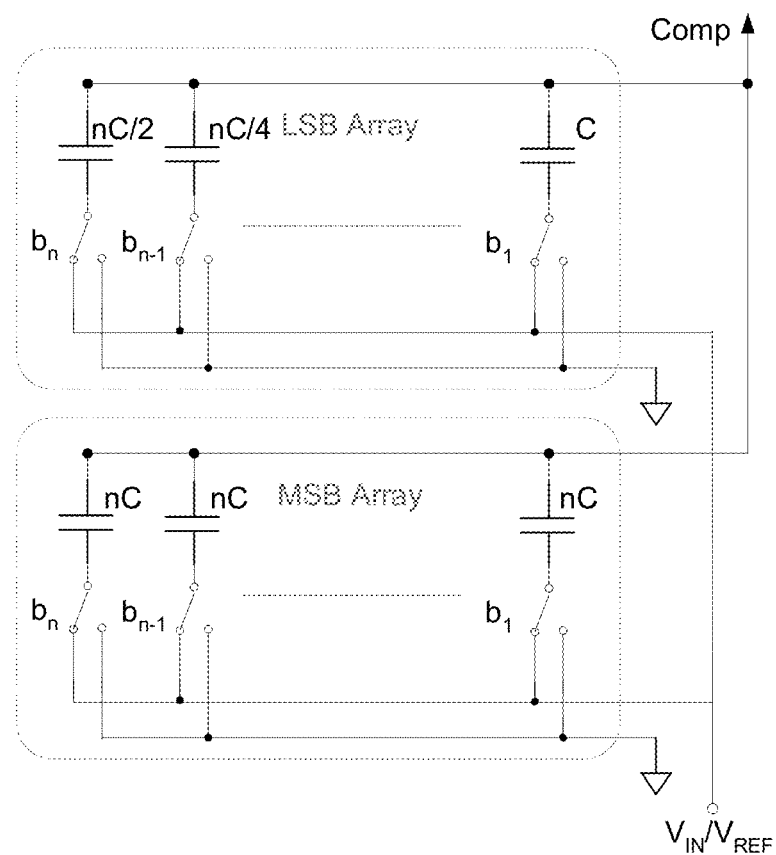
FIG. 3 illustrates a prior art array for Digital Foreground Calibration.
Figure 4:
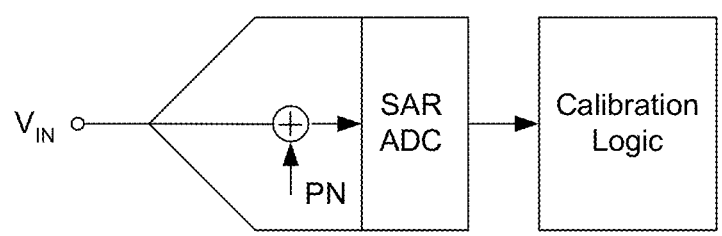
FIG. 4 illustrates a prior art Perturbation and Equalisation approach.
Figure 5:
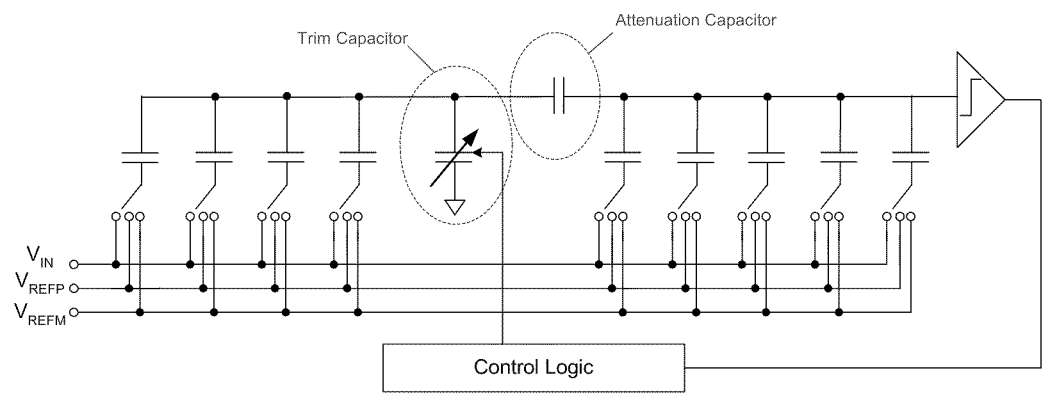
FIG. 5 illustrates a prior art method of calibration of gain error due to attenuation capacitor.
Figure 6:
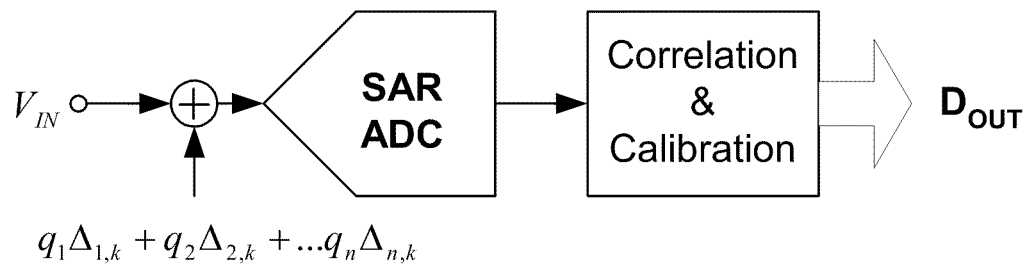
FIG. 6 illustrates SAR ADC with Calibration Scheme.
Figure 7:
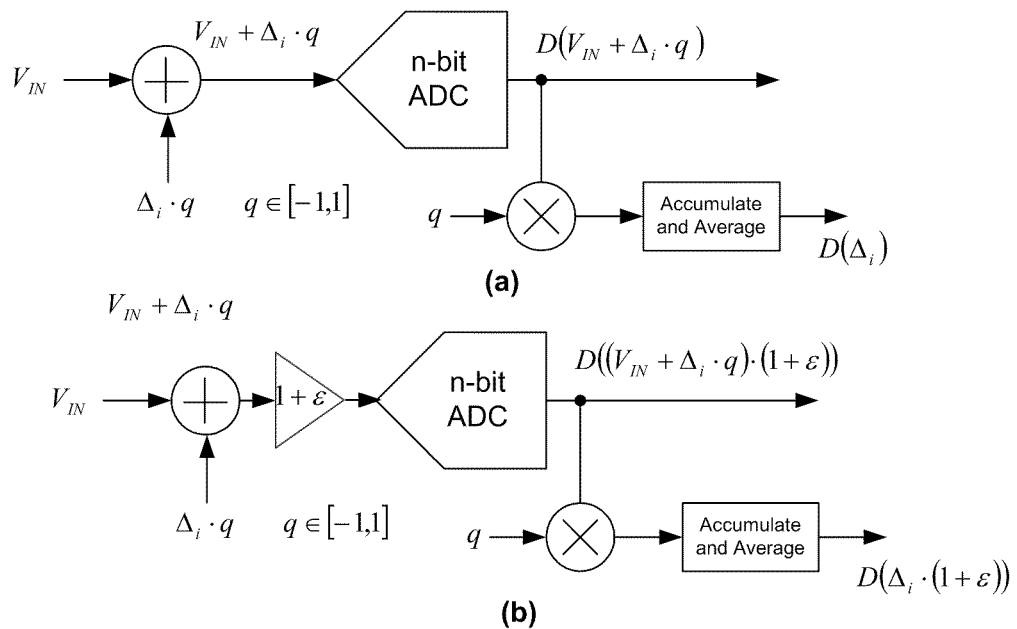
FIG. 7 illustrates an implementation of (a) PN injection and Measurement by Correlation (b) with error.

FIG. 6 illustrates a typical SAR ADC comprising of a DAC consisting of n relative weighted capacitors (or other elements in other embodiments) for example [64, 32, 16, 8, 4, 2, 1]. Due to mismatch the relative weights of these capacitors varies e.g. weights now are [63.2, 31.7, 15.8, 7.5, 3.8, 2.1, 1.3]. For calibration to take place the magnitude, and hence errors, of each capacitor has to be determined and compensated in the digital domain. To measure one of the capacitors it must be modulated by a PN sequence, the resulting voltage converted by the ADC, the digital values correlated with a PN sequence and finally the DC value determined (as shown in FIGS. 7a and 7b). However this would yield a foreground calibration scheme.

The principle of using a PN sequence to measure an analog quantity is shown in FIG. 7a. An additional voltage or element $\Delta_i$ (causing a voltage change) is multiplied by the pseudo random sequence q and is added to the input signal. This combined signal is processed by the ADC, converting it to a digital value. Multiplication of the digital value by the pseudo random sequence performs a correlation operation, the correlation value may be low pass filtered by an ideal integrator. This can be achieved by performing an accumulation and average operation. The output of the operation is a measure of the added element $D(\Delta_i)$. Note the input signal is removed as it is not correlated with the pseudo random sequence. This methodology can be used for calibration in pipeline ADCs. Each stage of the pipeline may be calibrated using the following stages as an n-bit ADC. As shown in FIG. 7b a gain error may be detected by the same method, the gain error is multiplied by the known value added to the input signal. The value of $\epsilon$ may be extracted and be calibrated for.

Figure 8:
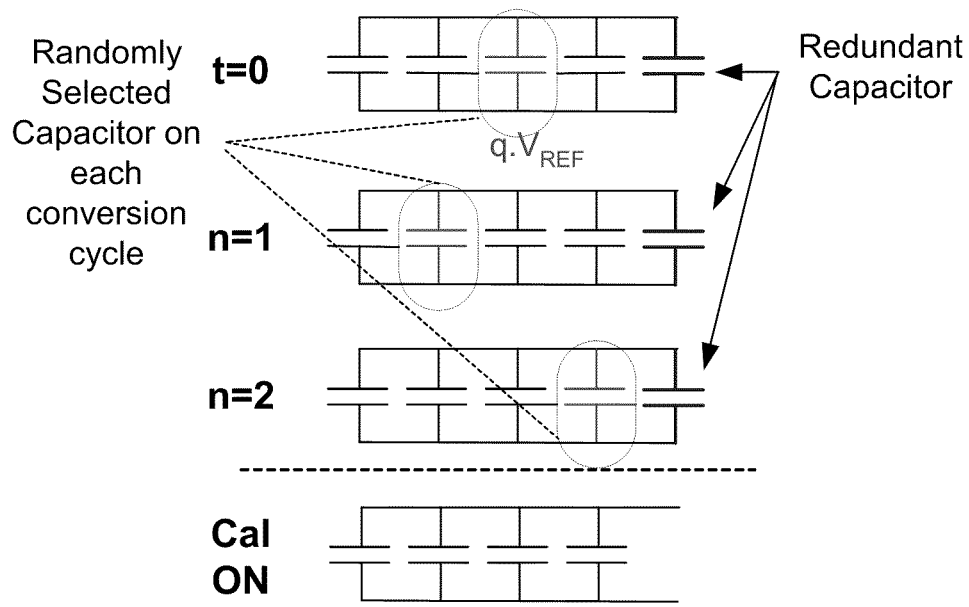
FIG. 8 illustrates operation of the calibration Scheme according to one aspect of the invention.

FIG. 8 illustrates operation of the calibration scheme according to the invention. In order to achieve a background calibration scheme each capacitor to be calibrated must be broken into m sub-capacitors in a DAC. As shown in FIG. 8 one of the sub-capacitors is chosen at random to be multiplied by a PN sequence generated. A redundant capacitor is used to approximately make-up the loss in the capacitor to be calibrated when it used for conversion. By using each of the sub-elements in turn the value determined by correlation is equal to $$D(\overline{\Delta_i}) = \frac{\Delta_{i,1} + \Delta_{i,2} + \ldots \Delta_{i,m}}{m}.$$

Figure 9:
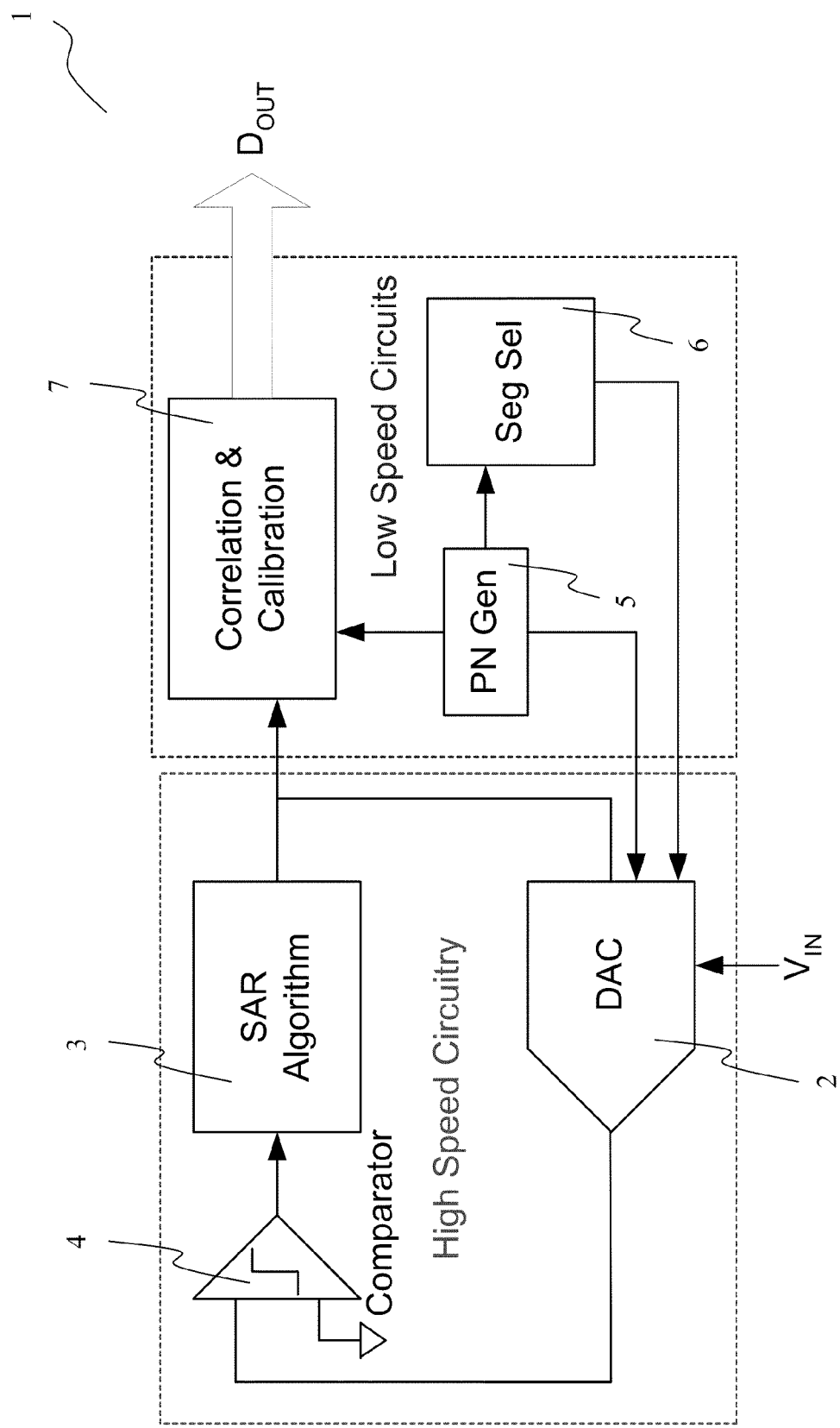
FIG. 9 illustrates a block diagram of the ADC with Calibration Scheme according to the invention.

The error $\epsilon_i$ between the measured value and expected value $D(\Delta \exp_i)$ is then added to the output codes exactly compensating for the error in the measured capacitor The top level block diagram of the SAR ADC with calibration according to a preferred embodiment of the invention is shown in FIG. 9, indicated generally by the reference numeral 1. The SAR ADC circuit operates at n times the sample rate (n cycles to complete a single sample conversion) comprise of a DAC 2, a SAR Algorithm logic module 3 and a comparator 4. The SAR algorithm logic 3 and comparator 4 are not affected by the calibration operation. According to a first aspect of the invention the DAC 2 is modified to have capacitors split into segments and redundant capacitors are added as shown in FIG. 8. It will be appreciated that this does not affect the speed of DAC operation which is desired to operate as quickly as possible. Additional digital circuits operate at the lower speed sample rate comprising of a PN generator 5 and a sub-capacitor selection circuit 6. The sub-capacitor selection circuit 6 is configured to operate randomly. Low speed circuits determine selection of which segment is to be PN modulated and the value of PN sequence. Correlation module 7 comprises means for performing operations, averaging and calculation of the calibration value occur at the lower sample rate also.

Figure 10:
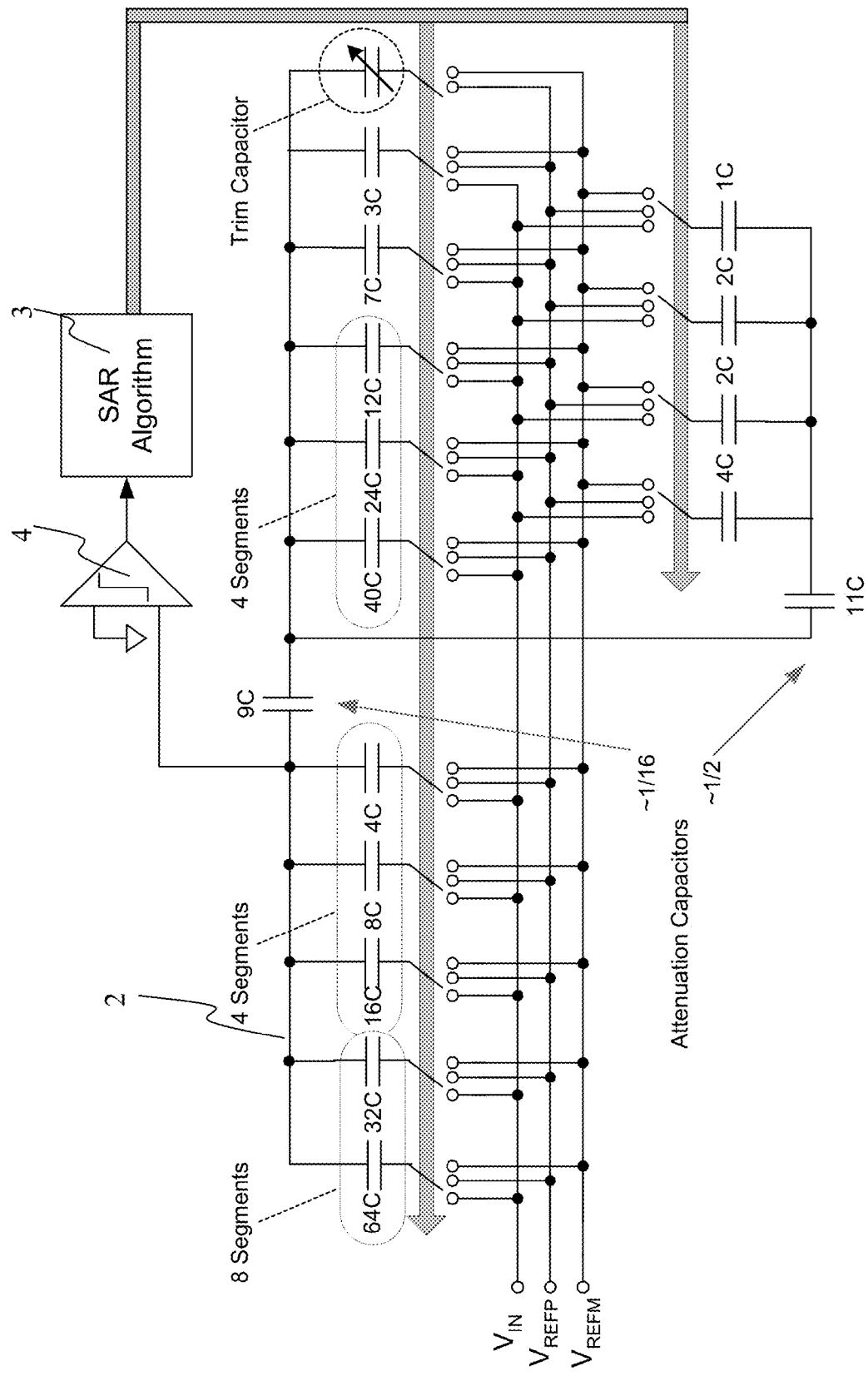
FIG. 10 illustrates SAR ADC High Speed Circuitry: DAC Array (redundant capacitors not shown), Comparator and SAR Algorithm Logic.

The detail of the high speed DAC circuitry is shown in FIG. 10. A capacitor array is formed from three sections, with one or more attenuation capacitors between the sections. The use of attenuation capacitors allows low values of input capacitance to be achieved. The calibration scheme is compatible with capacitor arrays using/not-using attenuation. In the embodiment shown the DAC array is designed for 12 bits with an additional two capacitors to enable redundancy to compensate for settling errors at high speed, although it will be appreciated other designs are possible. The capacitors to be calibrated are highlighted (rectangles with two rounded sides), with the number of segments each capacitor is to be broken into for calibration purposes denoted.

Figure 11:
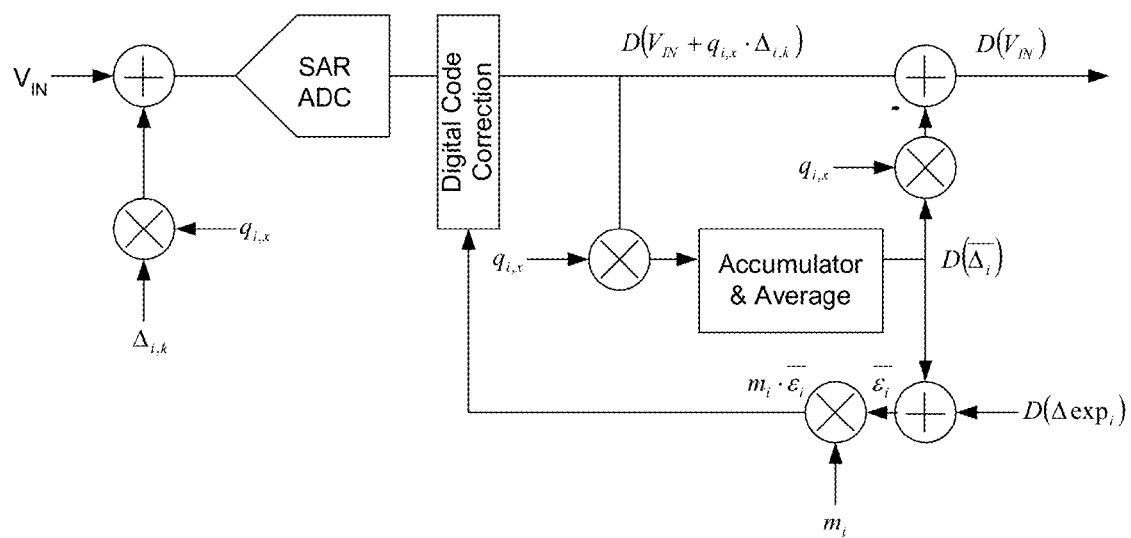
FIG. 11 illustrates a detailed implementation of correlation based calibration scheme according to the invention.
Figure 12:
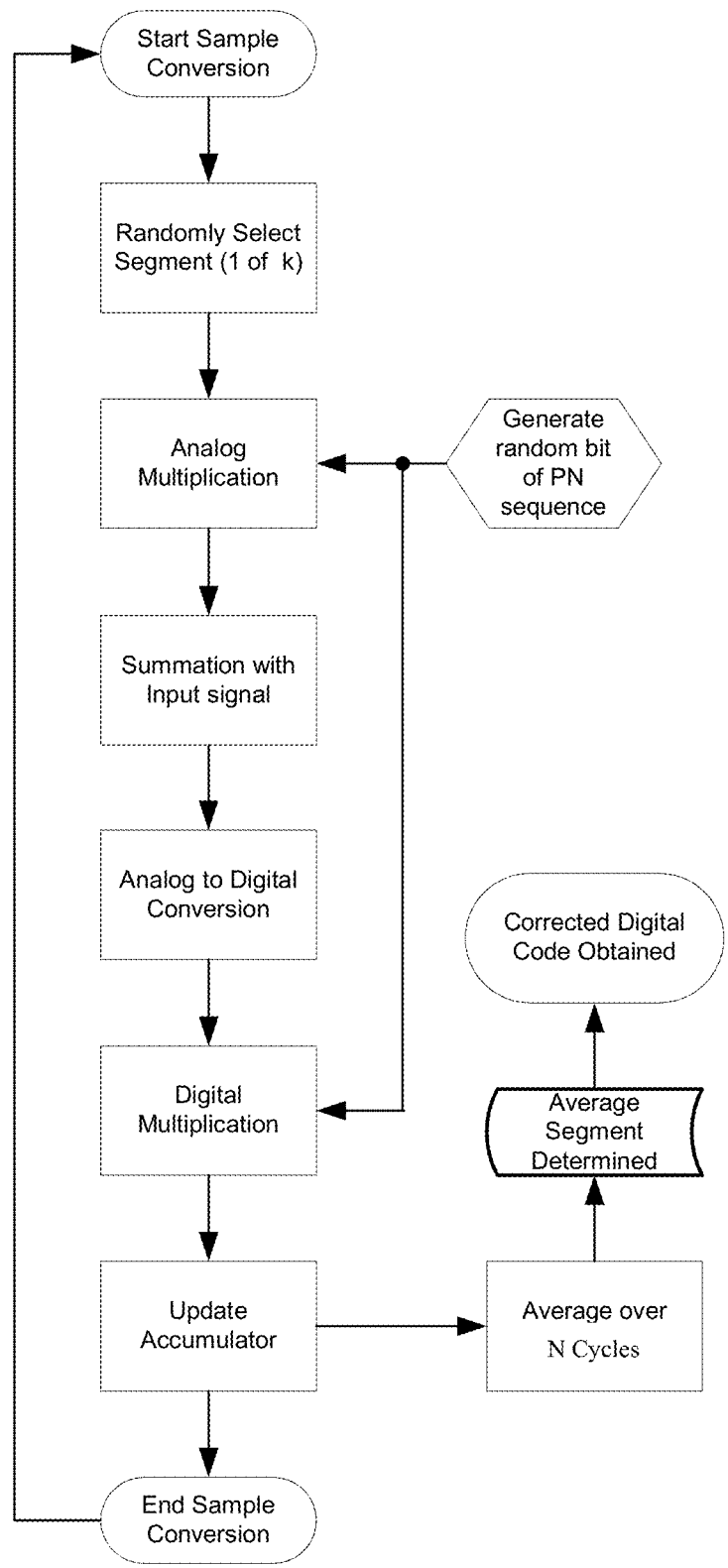
FIG. 12 illustrates a flow chart for the calibration scheme according to another aspect of the invention.

The detail of the complete calibration operation is shown FIG. 11. The operation of the calibration scheme can work in the following manner. Consider the calibration of the $i^{th}$ capacitor. The capacitor consists of $m_i$ segments, at the start of each conversion cycle one of the segments $\Delta_{i,k}$ is randomly selected to be multiplied by the current value of the pseudo random sequence $q_{i,x}$ which has the value either [-1,1]. Note that there is a separate sequence $q_i$ for each capacitor to be calibrated. A voltage directly proportional to the capacitor (can be assumed to be 1 for simplicity) is added to the input voltage, this is converted to a digital value $D(V_{IN}+q_{i,x}\cdot\Delta_{i,k})$ by the SAR ADC. The complete conversion takes place over n cycles as for a typical SAR ADC. The converted value is multiplied by the $q_{i,x}$ value to perform a correlation, the output is accumulated and averaged ($1^{st}$ order filter) to obtain a DC value $D(\overline{\Delta_i})$. Over many conversions this value converges to a digital representation of the mean of each of the $\Delta_{i,k}$ capacitor segments. Subtracting this value from the expected value for the capacitor segment $D(\Delta\exp_i)$ leads to an error value $\overline{\epsilon_i}$, this is multiplied by $m_i$ the number of segments to obtain the value used for correction $m_i\cdot\overline{\epsilon_i}$. Note that the value of $D(\overline{\Delta_i})$ is subtracted from $D(V_{IN}+q_{i,x}\cdot\Delta_{i,k})$ to leave $D(V_{IN})$, this is necessary to remove the effect of adding the capacitor segments in calibration mode. Note that imperfect subtraction does occur and converter performance will be impaired while calibration is running. This is because the value of $D(\overline{\Delta_i})$ is not exactly equal to the $D(\Delta_{i,k})$ on each sample. When calibration is complete all $q_{i,x}$ are set to zero and this error is removed. FIG. 12 illustrates a flow chart of the calibration scheme according to the invention.

In another embodiment of the invention the scheme can be extended for calibration of gain error due to the attenuation capacitor. Correction of the gain error due to attenuation capacitor requires extension of the calibration scheme. The gain error may be detected from the common gain applied to the measured value of capacitors on the RHS of the attenuation capacitor. This gain error may be used to select the value of a trim capacitor applied on the RHS which has the effect of adjusting the gain error.

Figure 13:
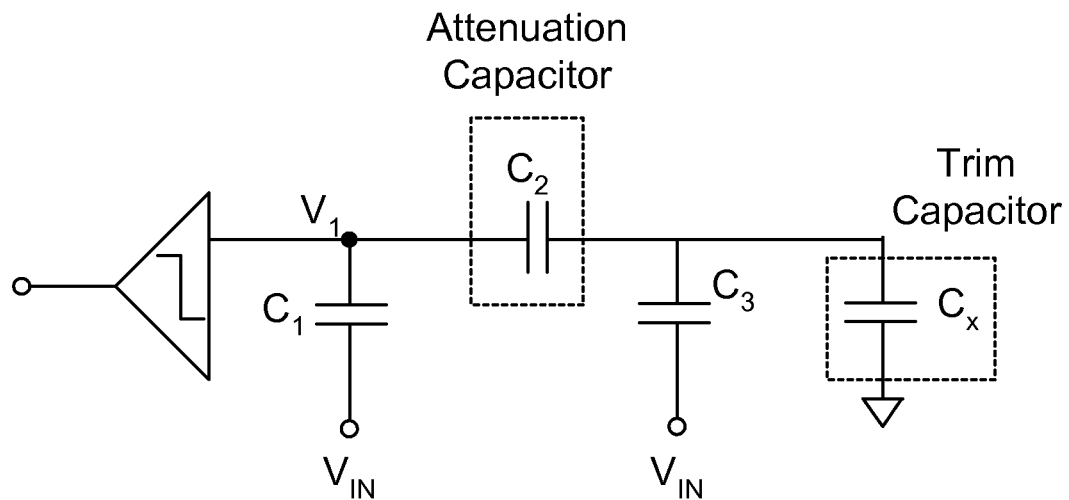
FIG. 13 illustrates use of a trim capacitor to calibrate attenuation capacitor according to another aspect of the invention.

FIG. 13 details the principle of gain correction utilising a trim capacitor. The attenuation of M between the LHS and RHS side of the array is given by:

$$M = \frac{C_1 + C_X}{C_2} + 1 \qquad (1)$$

if $C_x$ is set to zero $C_2=C_1/M-1$. If however $C_2$ is fabricated with an error and has the value $C'_2$, the value of attenuation M achieved will now have a gain error $M(1+\epsilon)$. Therefore from equation 1, the gain with error is given as, $$M(1+\varepsilon) = \frac{C_1}{C'_2} + 1 \qquad (2)$$

However by giving $C_x$ a non-zero value the gain error can be removed, $$M = \frac{C_1 + C_X}{C'_2} + 1 \qquad (3)$$

from equations 2, 3 the value of $C_x$ necessary to correct the gain error is given by, $$C_X = \frac{-C_1 N\varepsilon}{[M(1+\varepsilon)-1]} \qquad (4)$$

In the above expression the value of $C_2$ is not present, thus its value does not need to be measured.

It is noted that for the value of $C_x$ in the above equation is negative, this will be positive if $\epsilon$ is negative. Therefore in practice the nominal value of $C_2$ is designed to produce a negative gain error in M, so that it can be corrected by a positive (physically realisable) $C_x$.

Figure 14:
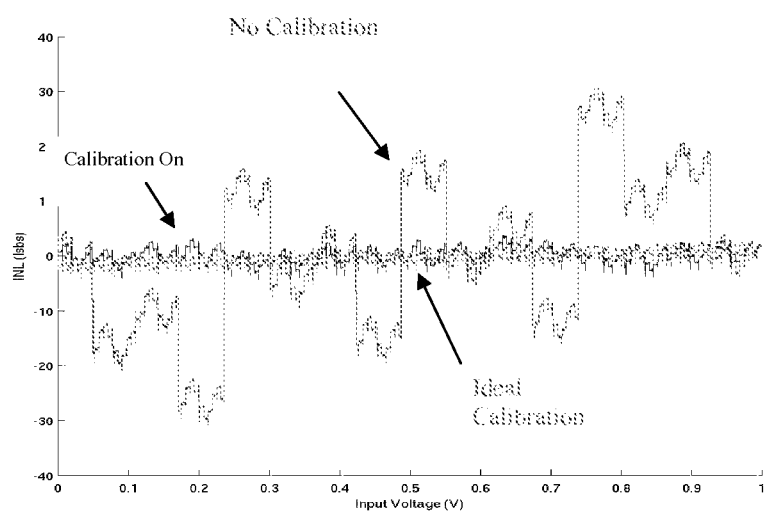
FIGS. 14 to 16 illustrate results obtained to confirm operation of the invention.
Figure 15:
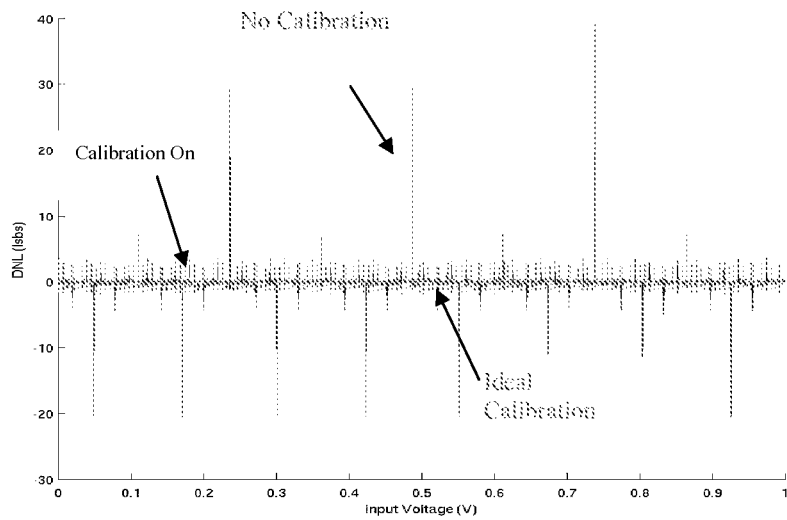
Figure 16:
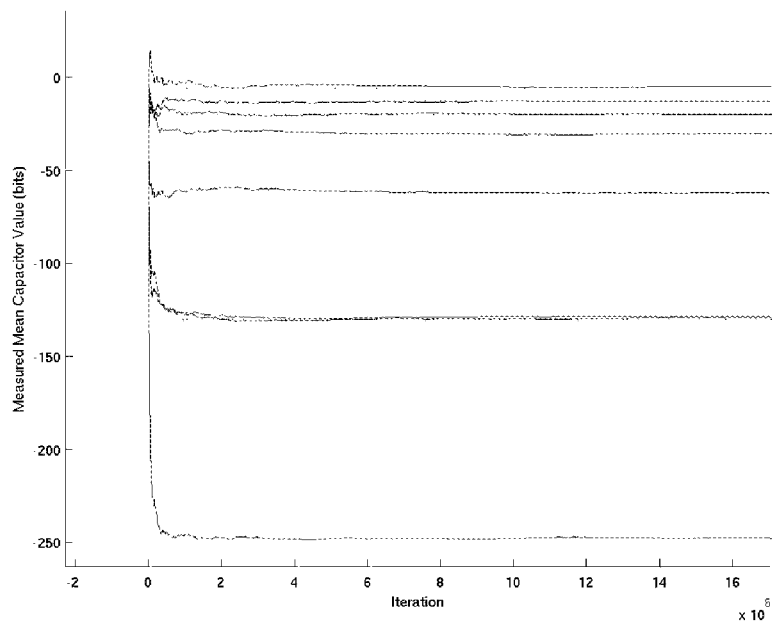

FIGS. 14 and 15 shows the INL and DNL outputs of a 12 bit ADC with calibration on/off obtained from MATLAB simulations. FIG. 16 details the convergence of the accumulated and averaged values of the capacitors $D(\overline{\Delta_i})$ in section (i) above.

It will be appreciated that FIG. 9 presents a top level overview of the system level blocks required in the digitally calibrated SAR ADC. This is observed to consist of a high operational speed section, which is composed primarily of analogue circuits. The second part of the system consists of a low operational speed digital section. FIG. 10 shows an overview of an embodiment of the High speed analogue circuitry. An alternative approach to FIG. 10 is presented in FIG. 17. The capacitor array uses the monotonic switching algorithm, and also enables calibration of the capacitors. Also contained in this disclosure are the details of analogue blocks supporting the capacitor array, these include: Double sampled (DS) input buffer, Clock Generator, Reference Buffer, Capacitor switching control logic and Comparator block. The monotonic switching approach and the individual blocks are detailed in the following sections.

Figure 18:
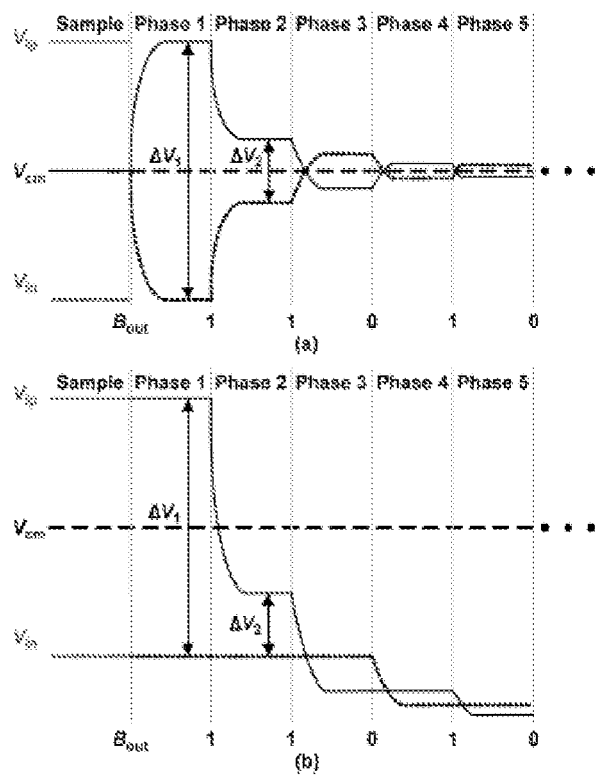
FIG. 18 illustrates (a) prior art Differential Switching, (b) prior art Monotonic Switching.
Figure 19:
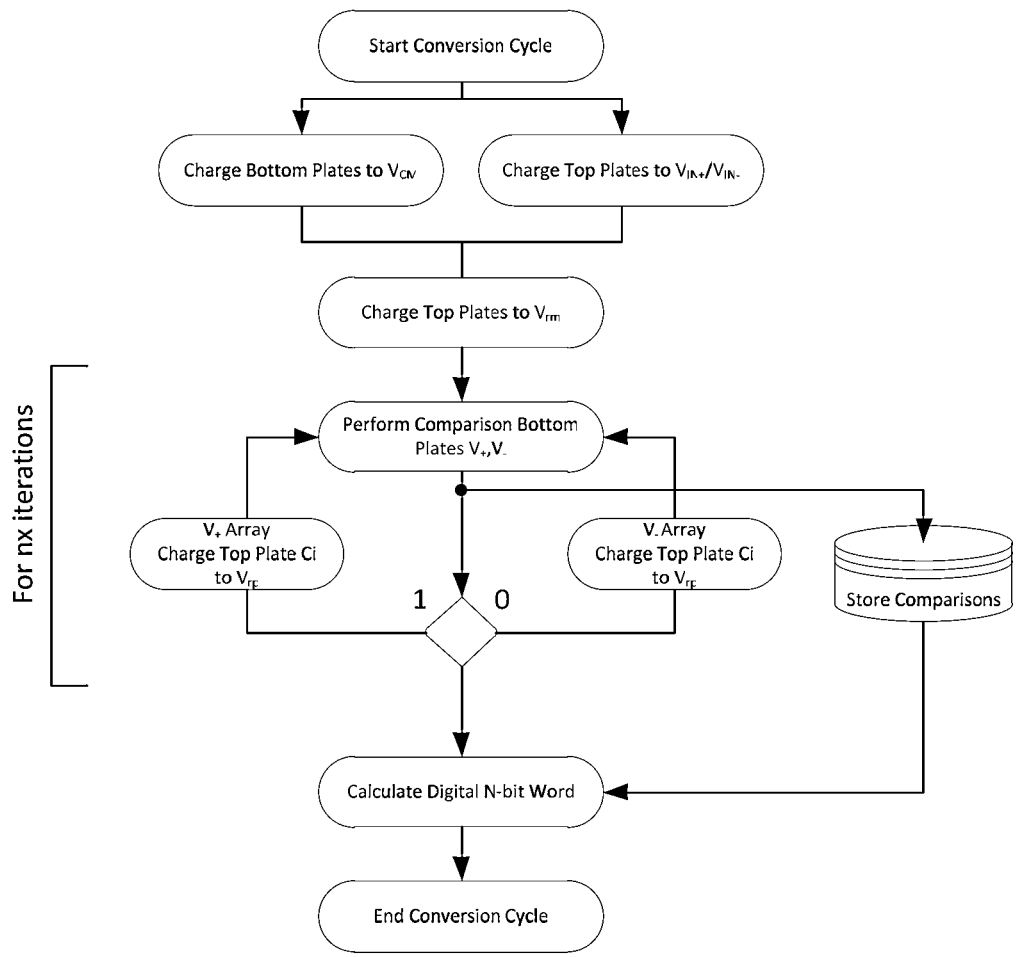
FIG. 19 illustrates a flow diagram of the presented Embodiment of the Monotonic Switching Algorithm.

The monotonic switching approach of Chun-Cheng Liu, Soon-Jyh Chang Guan-Ying Huang and Ying-Zu Lin, "A 10-bit 50-MS/s SAR ADC With a Monotonic Capacitor Switching Procedure" IEEE JOURNAL OF SOLID-STATE CIRCUITS, VOL. 45, NO. 4, April 2010, has been adopted in this embodiment to reduce power consumption caused by the charging and discharging of the capacitor array. The key benefit of the monotonic switching algorithm is to allow removal of the largest capacitor in the capacitor array without affecting SAR operation. In the embodiment presented here only 13 capacitors are required for a 14 step conversion algorithm. Further power saving is achieved by the monotonic switching algorithm as only the $V_+$ or $V_-$ node switches to a new voltage on each iteration. It is observed that the traditional differential switching approach (FIG. 18a) requires both nodes to switch simultaneously. In FIG. (18b) it is observed that the monotonic switching approach causes the common mode voltages on the capacitor bottom plates to tend towards ground. In the embodiment presented here the switching scheme is adjusted to cause settling of the $V_+$ or $V_-$ node towards $V_{CM}$ as the SAR algorithm iterates. This reduces the power consumed by the $V_{CM}$ buffer, as at the start of each sample the voltage is returned to $V_{CM}$. It is also noted that in Liu the input voltage is directly sampled onto the bottom plate. In the embodiment presented here traditional top plate sampling is used in order to allow implementation of the calibration scheme shown in FIG. 8. The monotonic switching algorithm adopted for this embodiment is detailed in FIG. 19.

Figure 17:
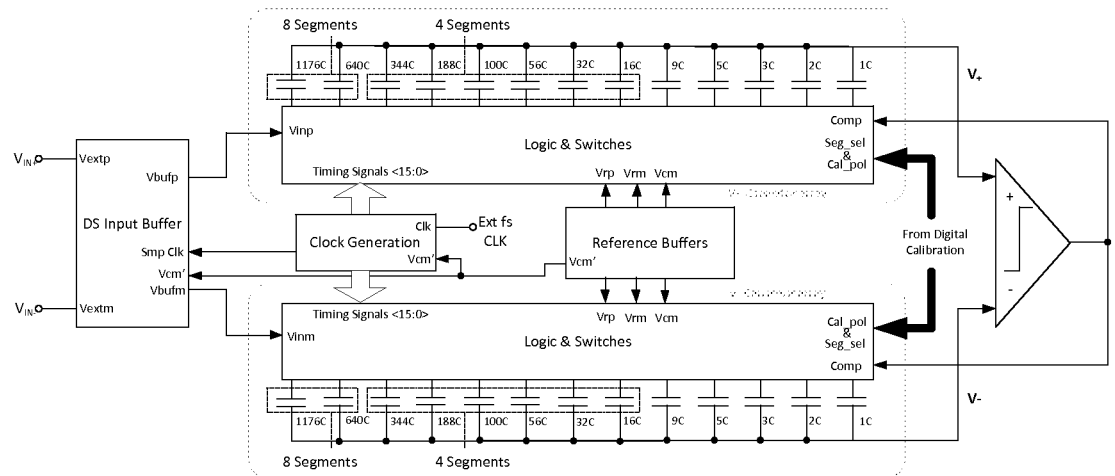
FIG. 17 illustrates a complete Embodiment High Speed Analogue Section.
Figure 20:
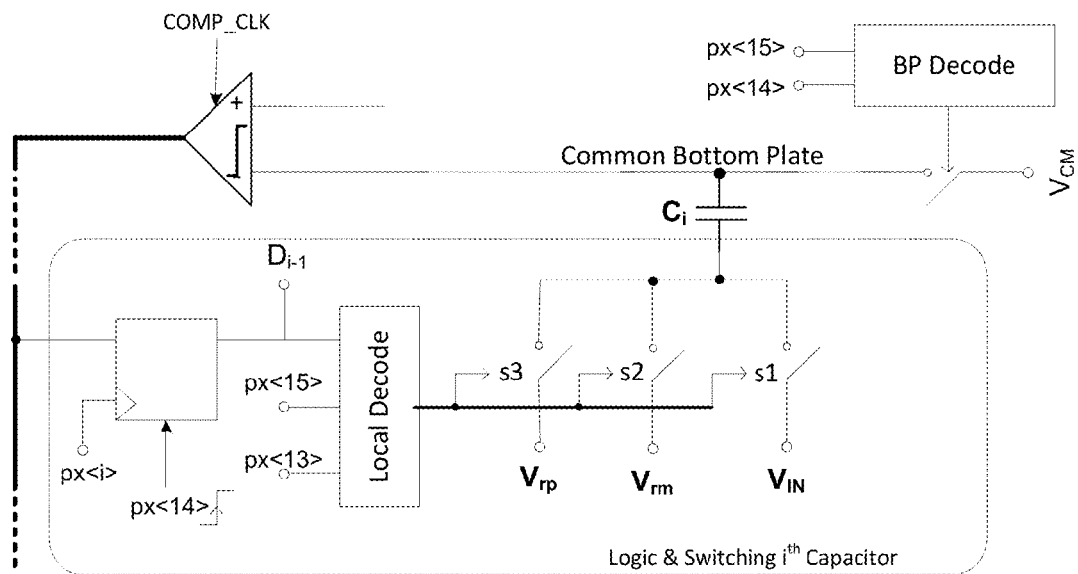
FIG. 20 illustrates (a) Logic for the $i^{th}$ Comparator (b) Timing Signal relationship, (c & d) logic truth table for switch control signals.
Figure 20:
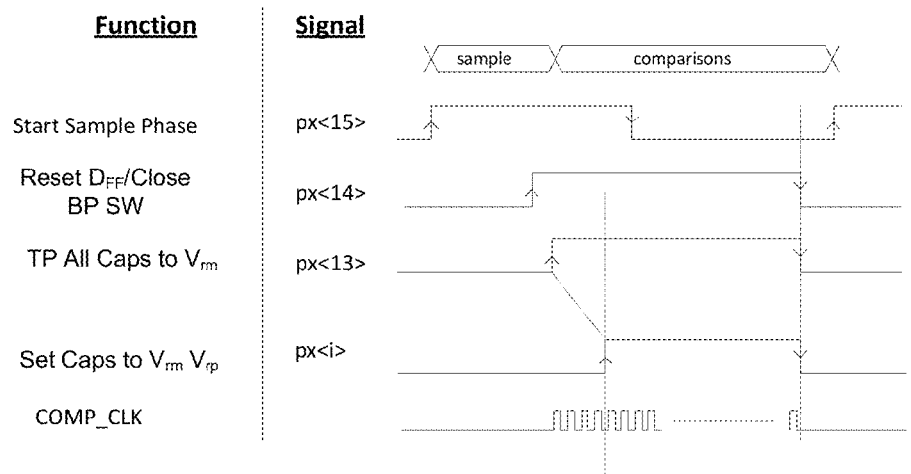

In order to enable the monotonic switching algorithm (FIG. 19) during each sampling cycle, high speed logic is required. This logic interprets the comparator decisions and the timing signals to initially switch the capacitors to the input voltage and then to the appropriate reference voltage. FIG. 20 details the logic and timing signals for the $i^{th}$ capacitor in the array, FIG. 20(a) details the logic cell required for each capacitor in the array. The logic is comprised of a D-type Flip-Flop (DFF), local decoder and switches which are connected to the references voltages $V_{rp}$, $V_{rm}$ and the input voltage $V_{IN+}/V_{IN-}$. (As shown in FIG. 17, the fully differential case will have replica logic circuits for the capacitors on both the positive and negative signal paths). The DFF and logic are controlled by timing signals from the clock generation block. FIG. 20b details the time relationship of the timing signals. The signal px<15> enables sampling, the signal px<14> resets the DFF to zero before the SAR iterations (comparisons) occur. In addition px<15> and px<14> also enable the switch on the common bottom plate of the capacitors in the array (BP Decode). Therefore the input signal is sampled with respect to a known voltage. The rising edge of px<14> causes the bottom plate switch to open before the capacitor top plates are disconnected from the input voltage thereby reducing signal dependent charge injection onto the sampled voltages. px<13> denotes the end of the sampling phase and causes the $C_i$ capacitor top plate to be switched to $V_{rm}$. The first comparator decision occurs after px<13>. For the $i^{th}$ capacitor in the array the preceeding comparator decision result $D_{i-1}$ is clocked into the DFF by px<i>, the capacitor is then switched to $V_{rp}$ or remains connected to $V_{rm}$ depending on the value of $D_{i-1}$. Note that at the end of each sample conversion cycle that the values of the registers are read into the digital portion of the system for conversion to an N-bit digital word. An additional register is required to store the value of the final comparison result.

Figure 21:
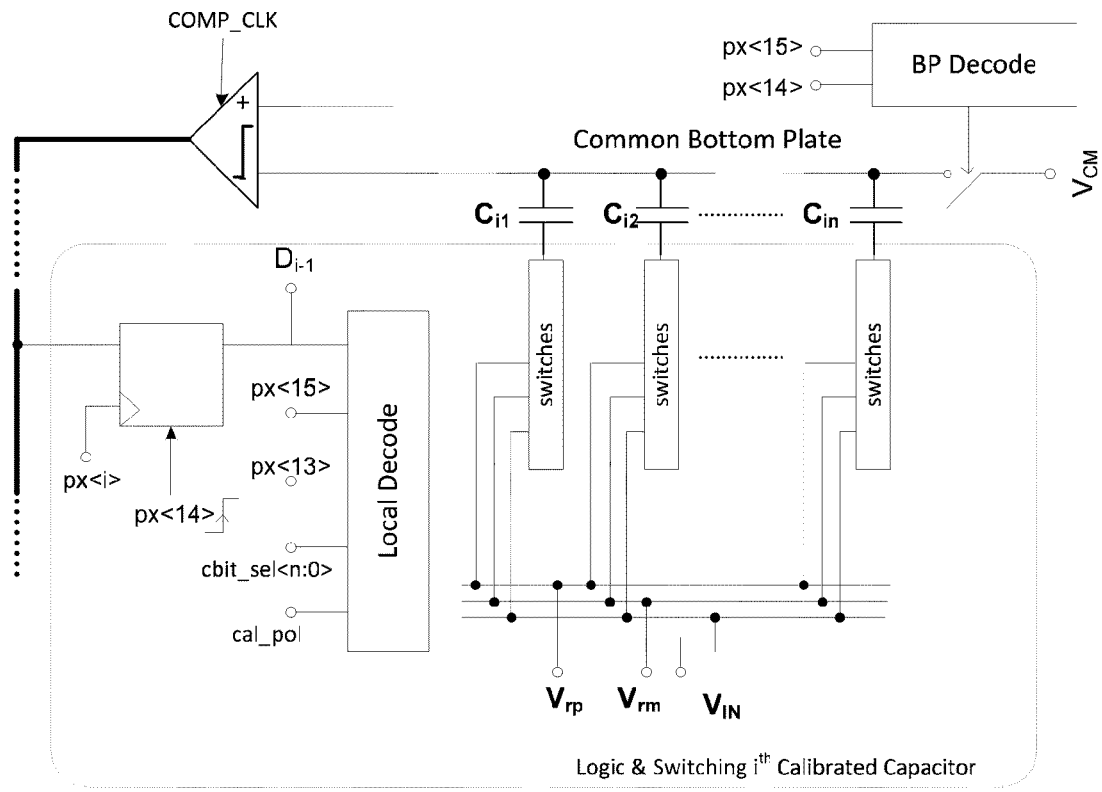
FIG. 21 illustrates a high Speed logic with Calibration.

In order to enable calibration the capacitor to be calibrated is split into a number of equal number (n−1) segments with an additional redundant capacitor added, where the redundant capacitor is nominally equal to one of the segments as shown in FIG. 8. The logic for the $i^{th}$ capacitor is modified to accommodate switching each of the segment capacitors (FIG. 21). Two additional signals are introduced c_bit_sel<n:0> and cal_pol. These signals are generated by the low speed digital calibration logic and select which segment of the $i^{th}$ capacitor in the current sample conversion cycle is to have a random bit with polarity denoted by cal_pol applied to it. During the sample phase the selected segment is switched to $V_{rm}$ or $V_{rp}$ depending on cal_pol (FIG. 21). The other segments and the additional redundant segments are connected to the input voltage during sampling. This ensures that the random signal and the input signal are both processed. At the end of the sample phase denoted by the rising edge of px<13>, all segments are connected to $V_{rm}$, the segment selected to have the random bit applied to it will remain connected to $V_{rm}$ over the remainder of the conversion cycle. The remaining segments and the redundant segments behave as a single capacitor as detailed in the previous section.

Figure 22:
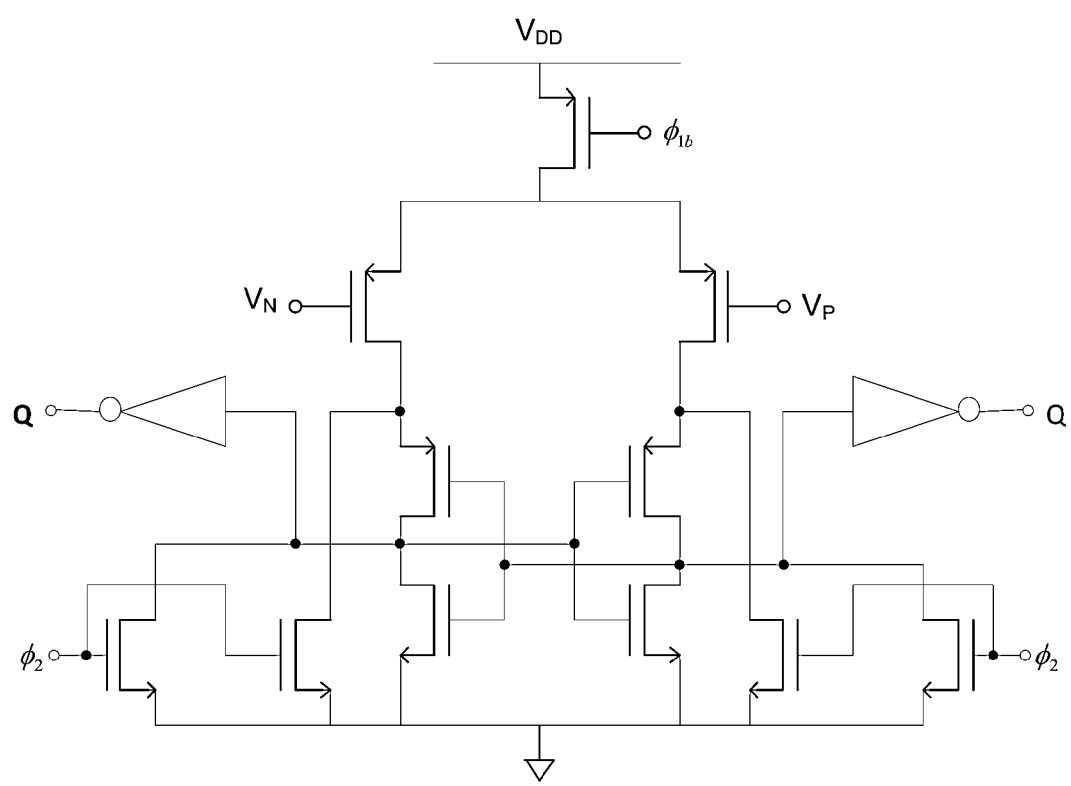
FIG. 22 illustrates a dynamic Comparator.
Figure 23:
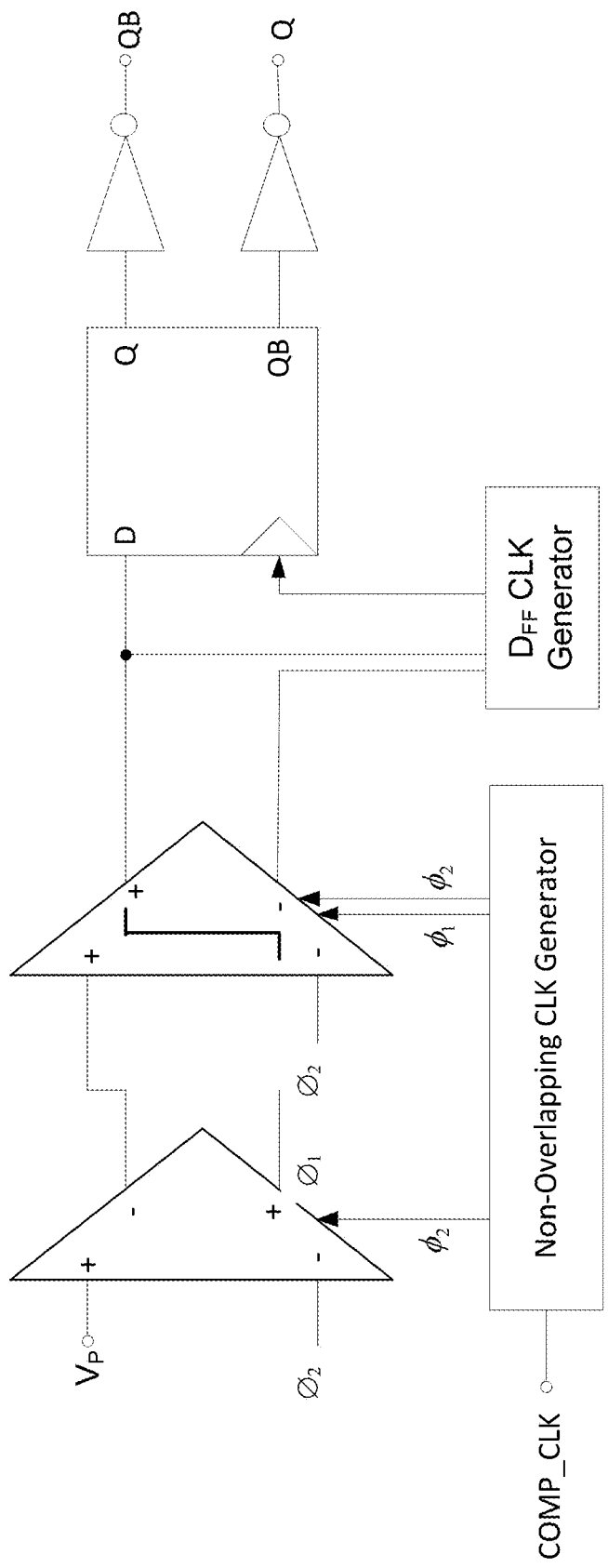
FIG. 23 illustrates a comparator Top Level.
Figure 24:
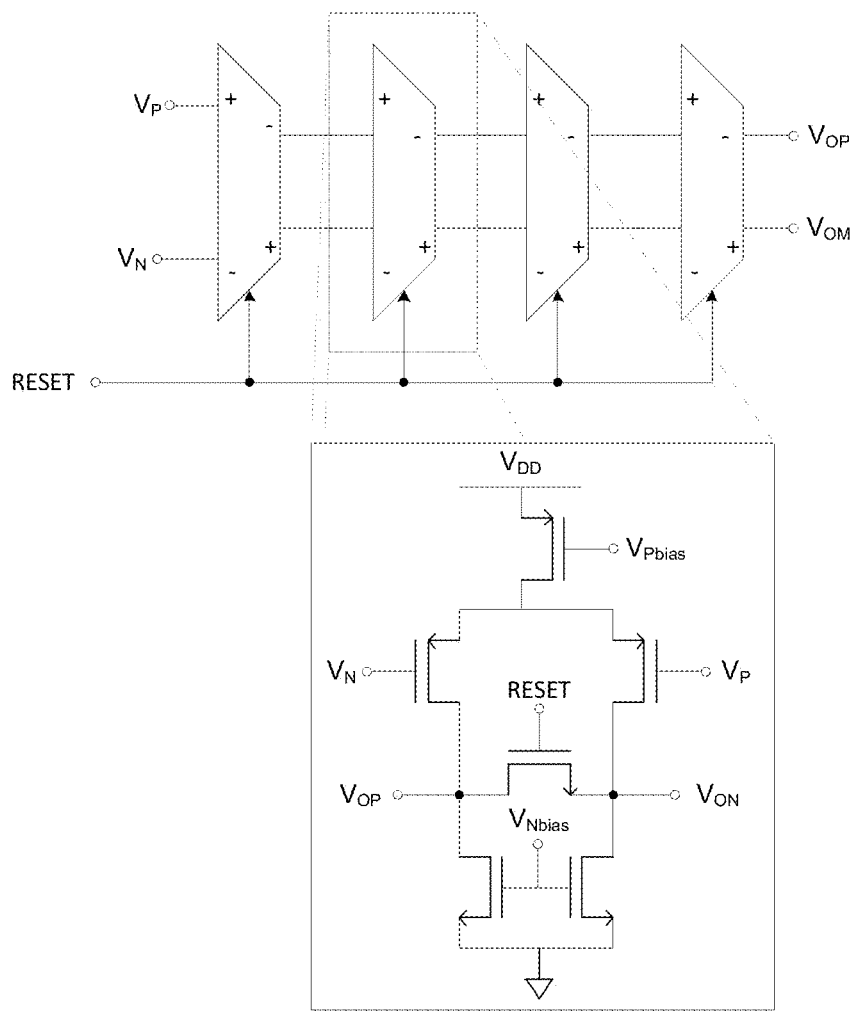
FIG. 24 illustrates a Comparator Open Loop Pre-Amplifier.

In order for comparison to occur between the positive and negative signal paths a comparator circuit is required. A high speed comparator is necessary due to the high effective clock rate required by the number of iterations of the SAR algorithm which must take place within the sample conversion time. In order to achieve high comparison speed and reduce power consumption a dynamic type comparator is utilized (FIG. 22). A second consideration is to reduce input referred thermal noise of the comparator to the less than the required level. Design of a low thermal noise comparator would require large input devices which present significant parasitic capacitance. Coupling of the comparator switching transition through the parasitic capacitance leads to undesirable kickback-noise onto the capacitor arrays common bottom plates. In order to reduce kickback a pre-amplifier is inserted before the comparator (FIG. 23). The comparator size may then be reduced as the thermal noise requirement is shifted to the input devices which are within the pre-amplifier. In order to achieve low thermal noise the preamplifier currents levels will be large. The preamplifier is shown in FIG. 24. The pre-amplifier consists of four cascaded open loop differential pairs which are resettable after each comparison is complete. The high gain and wide bandwidth of the forward path enables small differences in the input voltages to be amplified rapidly compared to a closed loop pre-amplifier approach. Note that the output of the comparator is latched onto a D_FF to buffer the comparator signal to the high speed logic circuits. The DFF clock is controlled by the comparator signals ensuring that the output is not loaded into the DFF until a logic level is reached.

Figure 25:
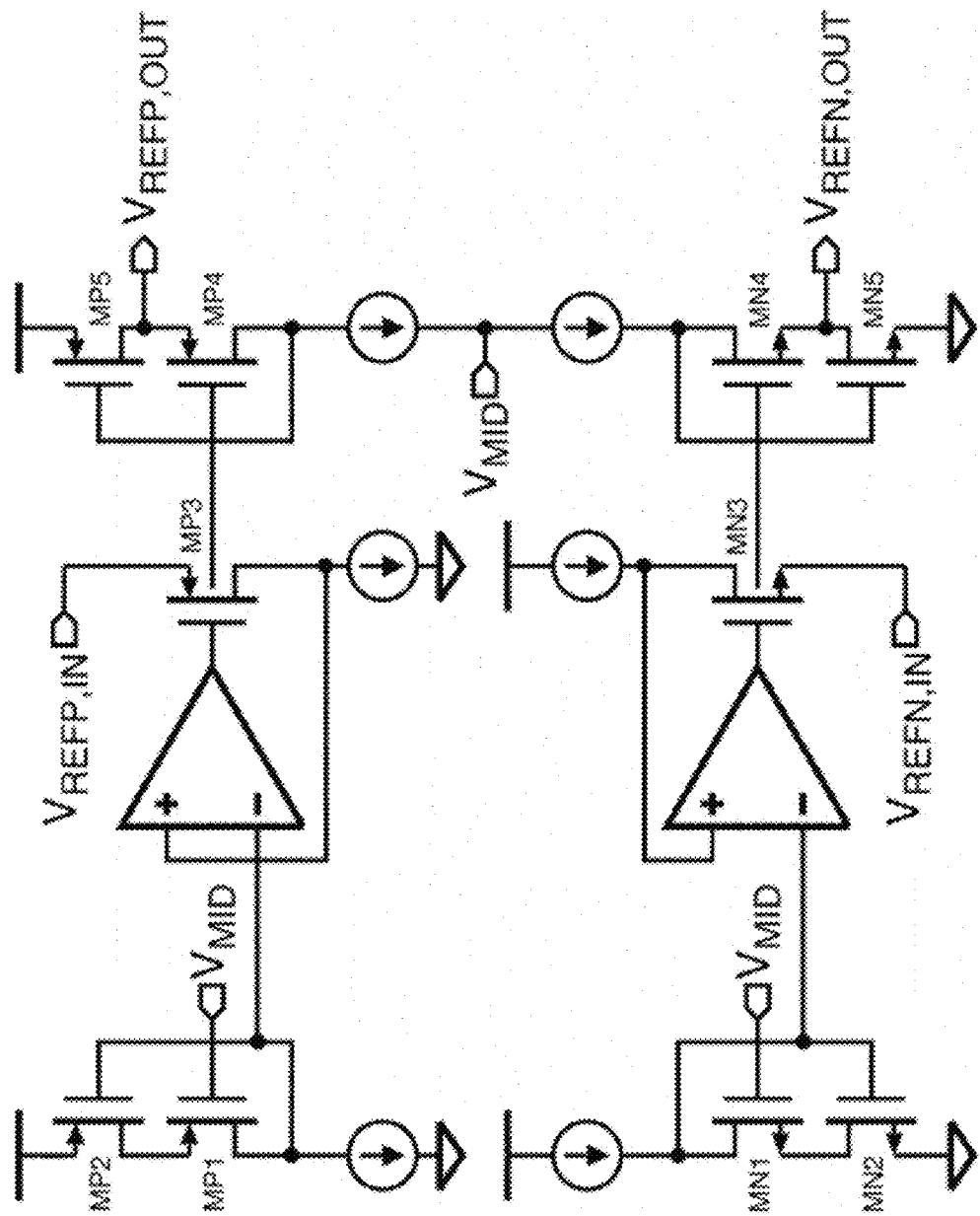
FIG. 25 illustrates a Prior Art Reference Buffer developed.

A reference buffer circuit is necessary to charge and discharge the capacitors of the array to the appropriate reference voltages $V_{rp}$, $V_{rm}$ and $V_{cm}$, $V_{cm'}$. Due to the high switching rate of the capacitors and the effect of switching all capacitors to $V_{rm}$ on a single cycle (px<13>) the reference buffers are required to be wide bandwidth circuits in order to achieve fast settling to the required voltage levels. Note that due to in-built redundancy of the SAR algorithm a certain amount of settling time error can be tolerated. It is further noted that the settling time of the $V_{cm}$ buffer is reduced due to the behaviour of the monotonic switching algorithm resulting in the common back plates tending to $V_{cm}$ over the SAR conversion cycle. The capacitive load of the $V_{rp}$ and $V_{rm}$ buffers are reduced by the monotonic switching algorithm over a conventional differential switching approach. However in order to meet setting requirements a conventional closed loop buffer approach is not feasible, an open loop approach allows faster settling with the penalty of loss in absolute accuracy of the reference levels which introduces a slight gain error into the final ADC conversion characteristic. FIG. 25 details an open loop buffer developed in T. Piessens, M. Steyaert and E. Bach "A Difference Reference Voltage Buffer for ΔΣ-Converters" Journal Analog Integrated Circuits and Signal Processing, Vol 31, Issue 1, April 2002 and extended in F. Borghetti, J. Nielsen, V. Ferragina, P. Malcovati, P. Andreani, A. Baschirotto "A Programmable 10b up-to-6MS/s SAR-ADC Featuring Constant-FoM with On-Chip Reference Voltage Buffers", 32nd European Solid-State Circuits Conference, 2006. ESSCIRC 2006.

Figure 26:
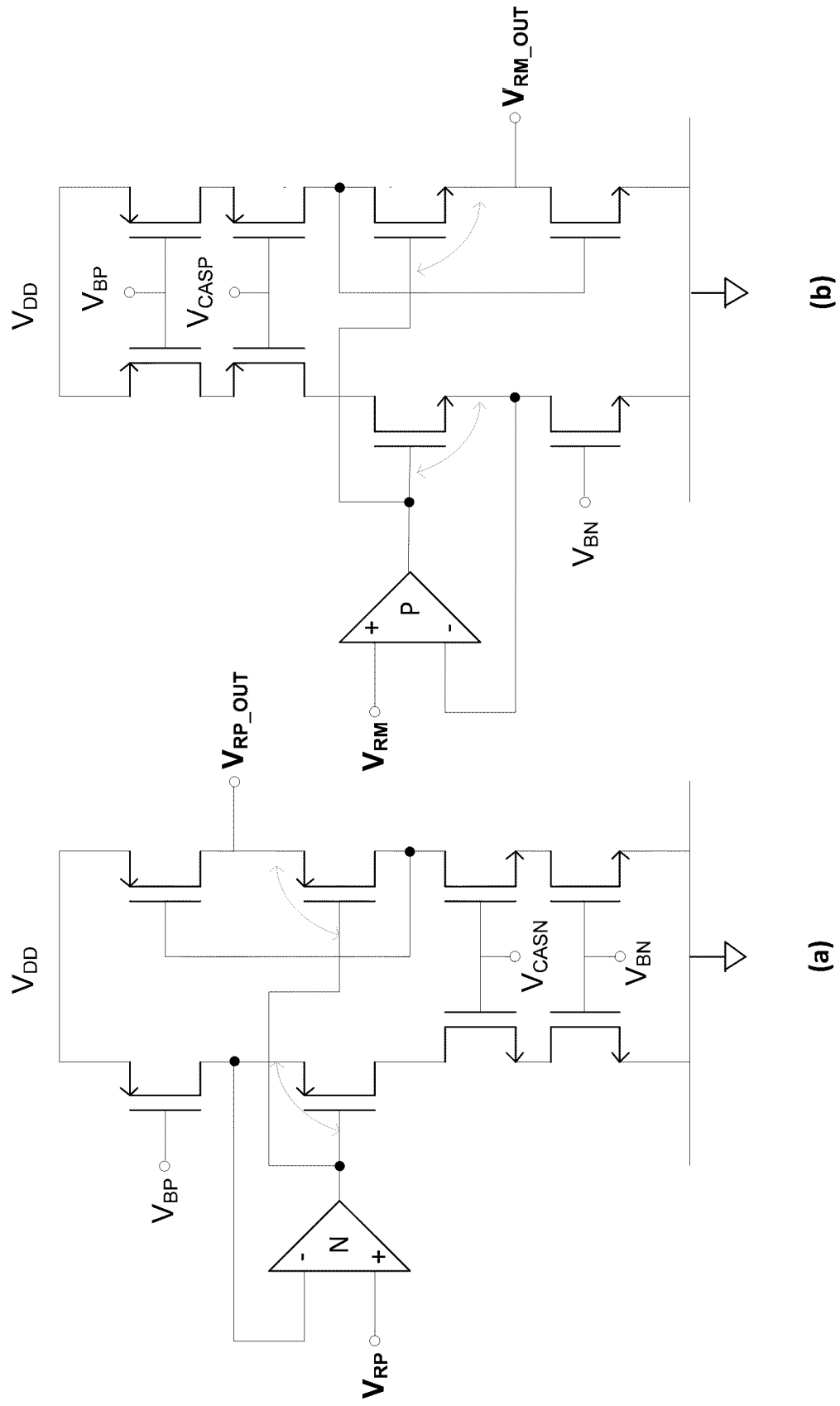
FIG. 26 illustrates a Reference Voltage Buffers in this embodiment.

The reference buffer scheme used in this embodiment is detailed in FIG. 26 below. It is noted in this embodiment in contrast to FIG. 25, that the control voltages for the output buffer stages is generated across the gate-source terminals as opposed to gain to drain terminals.

The input buffer block is necessary to allow interfacing of the high speed analog section to the external input voltages $V_{IN+}/V_{IN-}$. The input buffer provides current drive to the capacitors of the array during sampling and provides a level shift of the ground referred input voltage to be centered around the common mode level $V_{CM}$. A switched capacitor (SC) approach for this block is suitable as a sample and held signal may be applied to the capacitor array, secondly the SC technique allows low distortion sample and hold of the input signal to be achieved. A basic SC sample and hold block will have a return to zero phase on one phase of the clock cycle.

Figure 27:
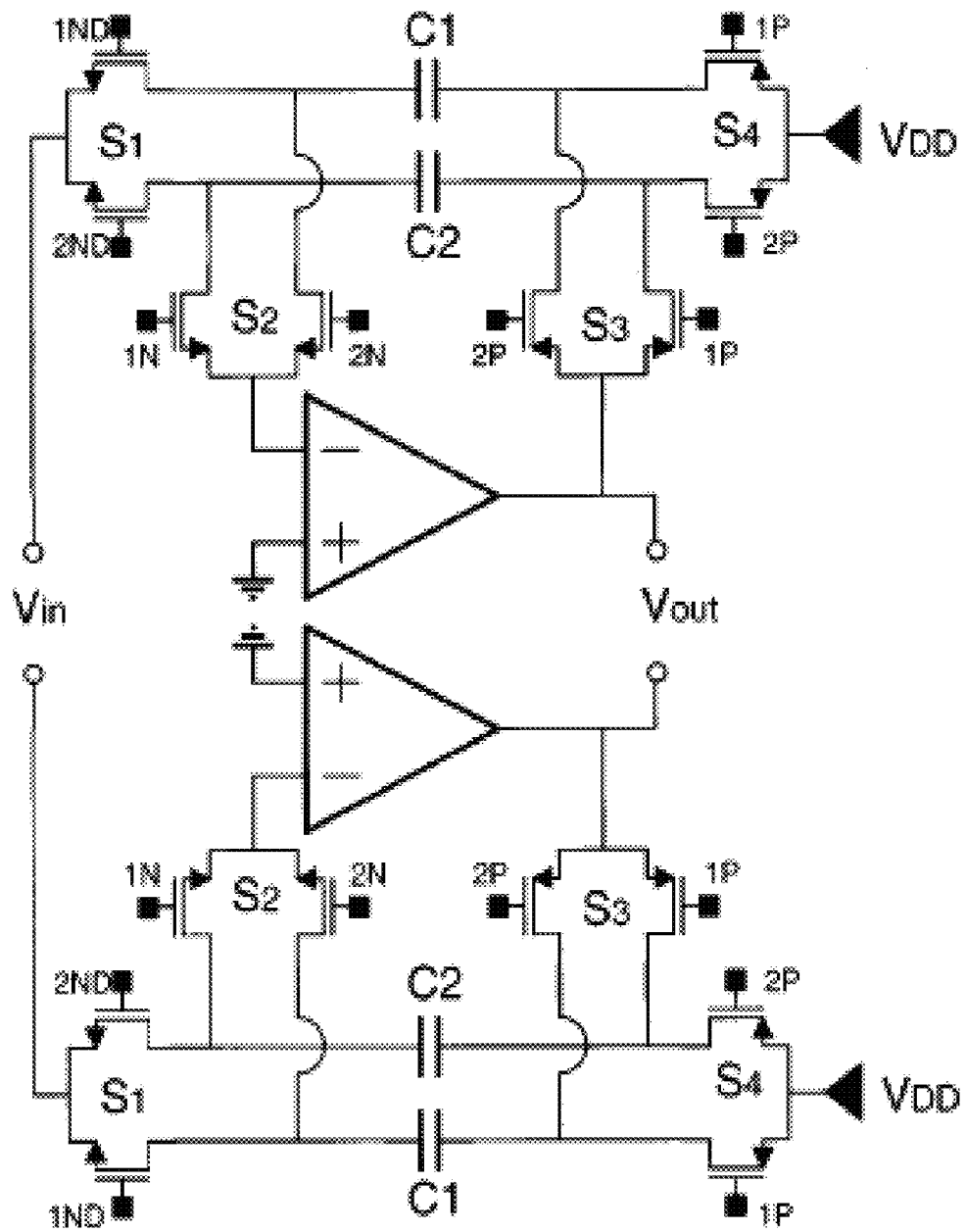
FIG. 27 illustrates a Prior Art for Input Buffer Stage.
Figure 28:
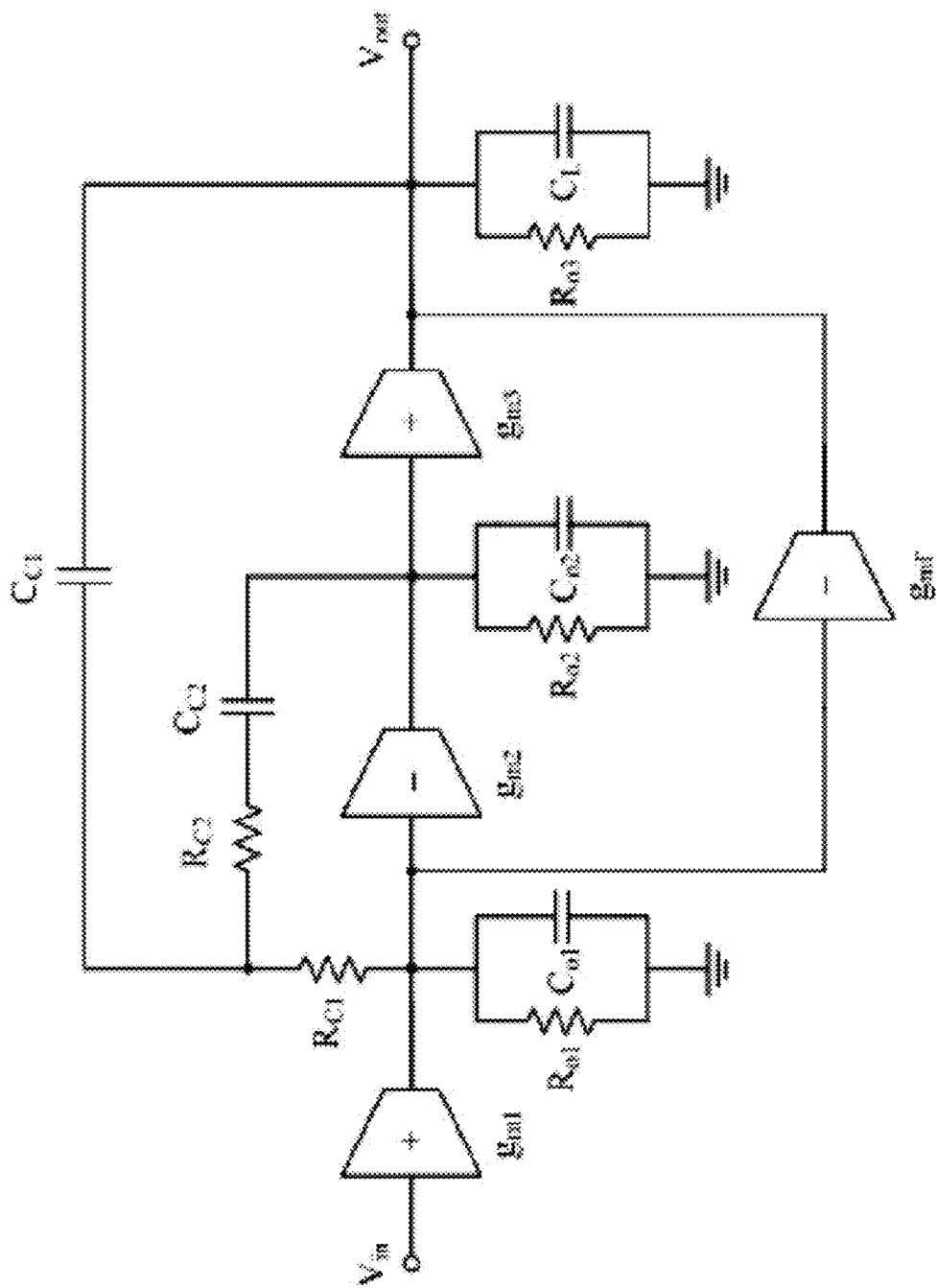
FIG. 28 illustrates a Prior Art for Input Buffer Stage.

This will cause distortion even with low input frequencies as the amplifier will have to slew and settle from the $V_{CM'}$ level for each new sample. The double sampling approach Andrea Baschirotto "A Low-Voltage Sample-and-Hold Circuit in Standard CMOS Technology Operating at 40 Ms/s". IEEE TRANSACTIONS ON CIRCUITS AND SYSTEMS—II: ANALOG AND DIGITAL SIGNAL PROCESSING, VOL. 48, NO. 4, April 2001 (FIG. 27) is utilized to provide a continuous signal at the output of the amplifier, reducing distortion from slew and settling. In order to produce a high gain amplifier for this circuit implemented on low voltage nanometer process technologies, cascaded type amplifier topologies A. D. Grasso, D. Marano, G. Palumbo "Reversed Double Pole-Zero Cancellation Frequency Compensation Technique for Three-Stage Amplifiers", Research in Microelectronics and Electronics 2006 (FIG. 28) are utilised.

Figure 29:
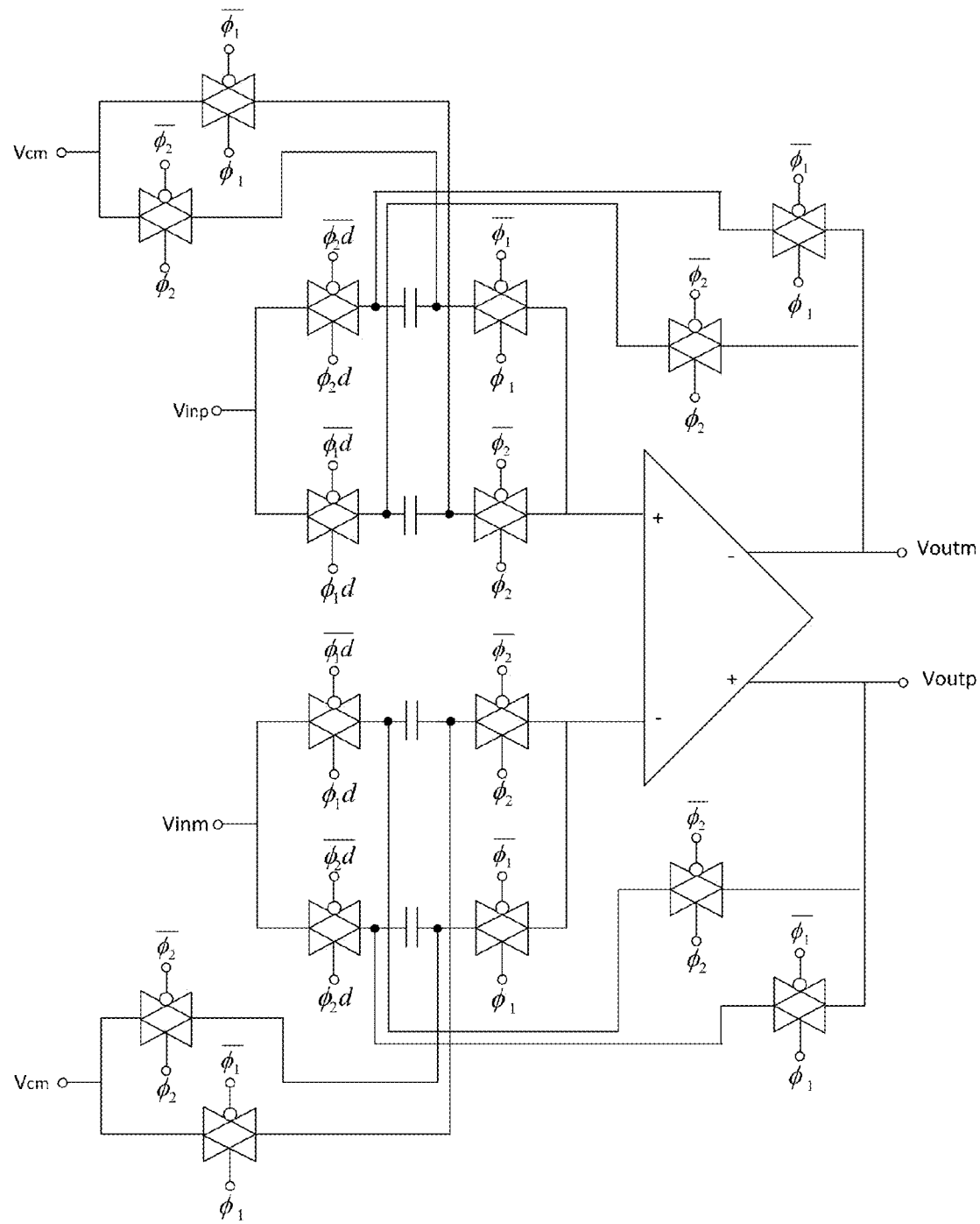
FIG. 29 illustrates a Double Sampled input buffer.

The double sampled input buffer with three stage reversed nested miller compensation amplifier presented in this embodiment is detailed in FIG. 29.

Figure 30:
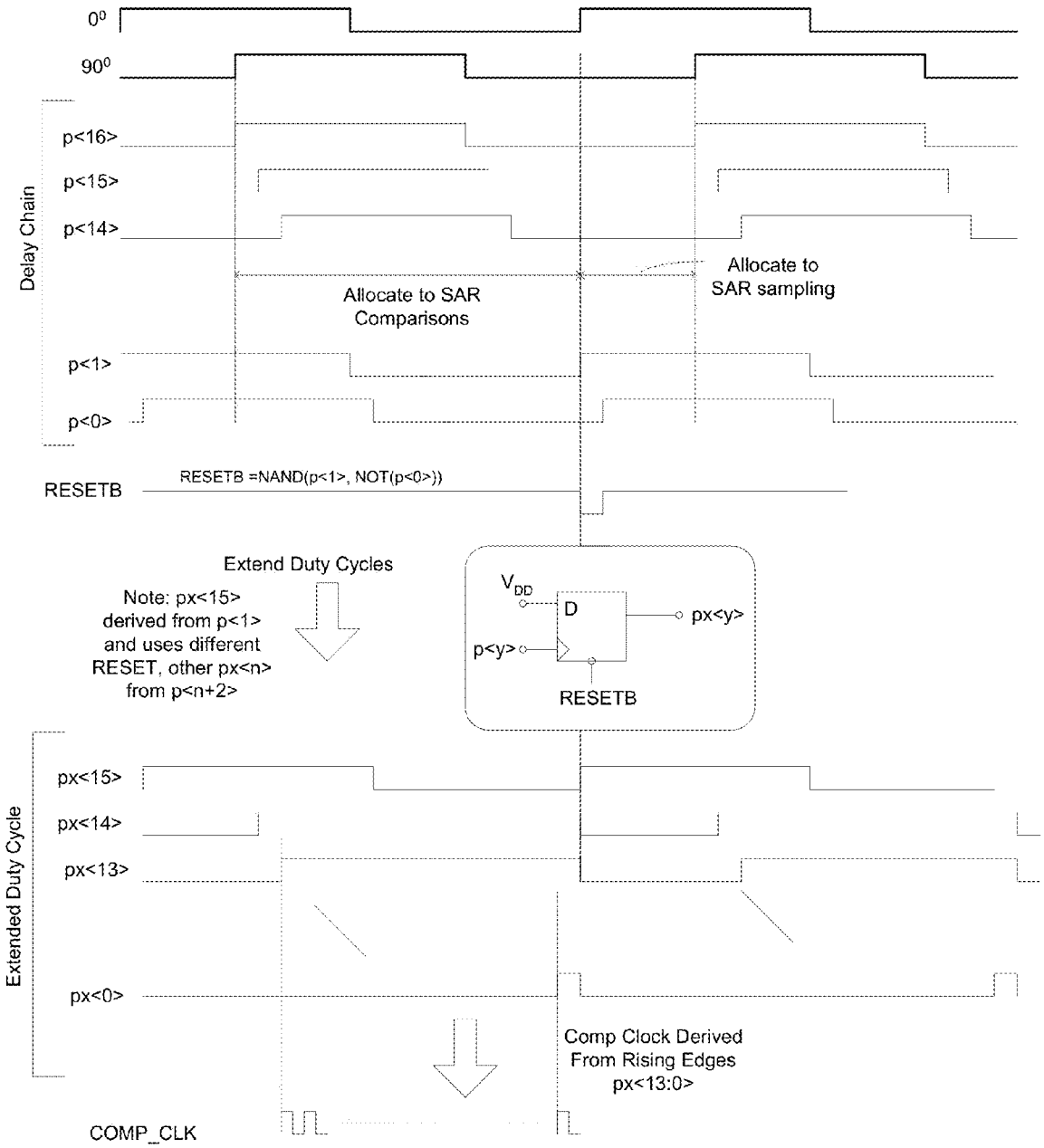
FIG. 30 illustrates a Clock Generation scheme.
Figure 31:
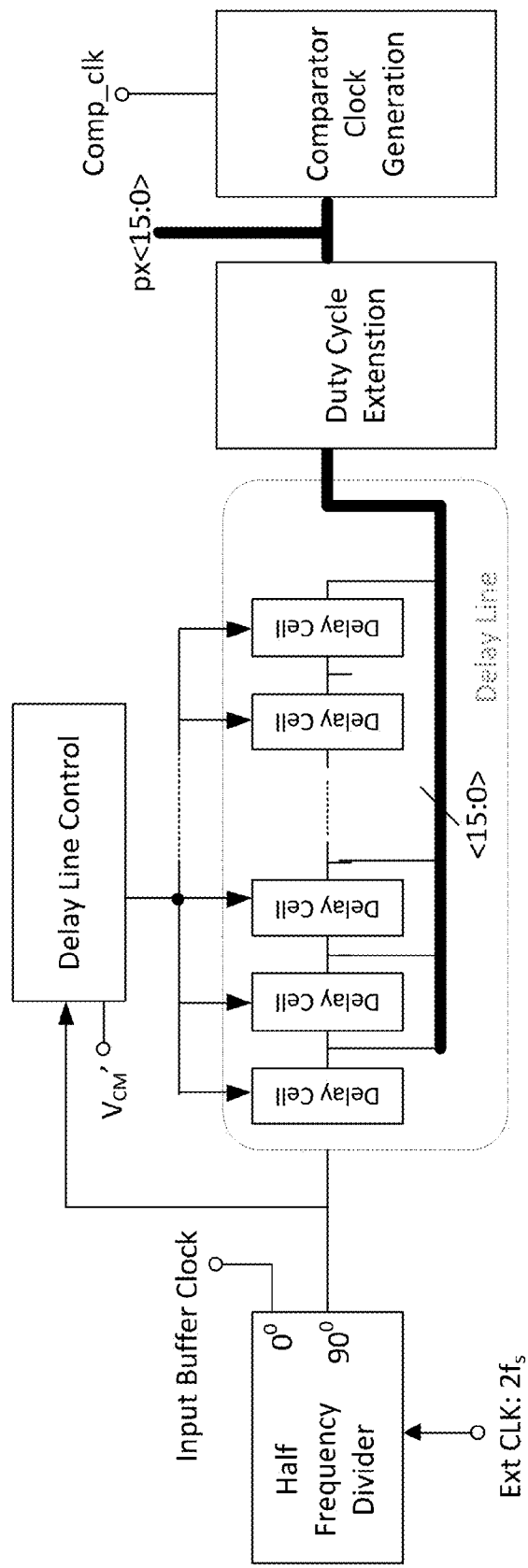
FIG. 31 illustrates a Clock Generation Block Schematic

The SAR ADC requires K iterations to perform a single sample conversion cycle. This requires an effective clock rate of at least $K*f_s$ where $f_s$ is the required sample rate and $K > N_{Bits}$, where $N_{Bits}$ is the number of bits required for conversion. In this embodiment K=20 and $f_s$=50 MHz. A high quality external clock at the 1 Ghz rate is not available. In this embodiment a delay line approach may be used to generate delayed input clock signals at the sample rate $f_s$ which are equivalent to a high speed clock. In this approach the sample clock signal clock period is conceptually divided into twenty equal intervals. Five of these intervals will be allocated to sampling the input signal, fourteen to the SAR iterations and one reset phase. FIG. 30 details generation of the timing signals previously detailed in the section on high speed logic blocks. FIG. 31 details the clock generation block which consists of a delay line with seventeen delay elements, delay line control block, clock duty cycle extension and comparator clock generator block. It is noted that a clock signal $2f_s$ must be supplied to the system which allows a half-frequency divider block to generate $0°$ and $90°$ clocks at $f_s$. The $0°$ signal may then be used to drive the input buffer block.

Of critical importance in the clock generation block is the delay through the delay line. An uncontrolled delay line would only operate at a single clock frequency and be highly susceptible to variations in components after manufacture. The addition of a control block allows correct timing clocks to be generated for input clock frequencies from 1 KHz to 50 MHz. The control circuit is adopted from Torelli, G.; De La Plaza, A. "Tracking Switched Capacitor Current Reference", Circuits, Devices and Systems, IEE Proceedings, Volume: 145, Issue: 1, 1998 Page(s): 44-47 which is used to generate currents for amplifiers in switched capacitor circuits depending on the sample rate. A current level $I_o$ is generated, given by the equation $$I_0 = \frac{C_1 V_{REF}}{T_P/2}$$

which is dependent on the capacitor $C_1$, input reference voltage $V_{REF}$ and the period of the input clock $T_p=1/f_s$.

Figure 32:
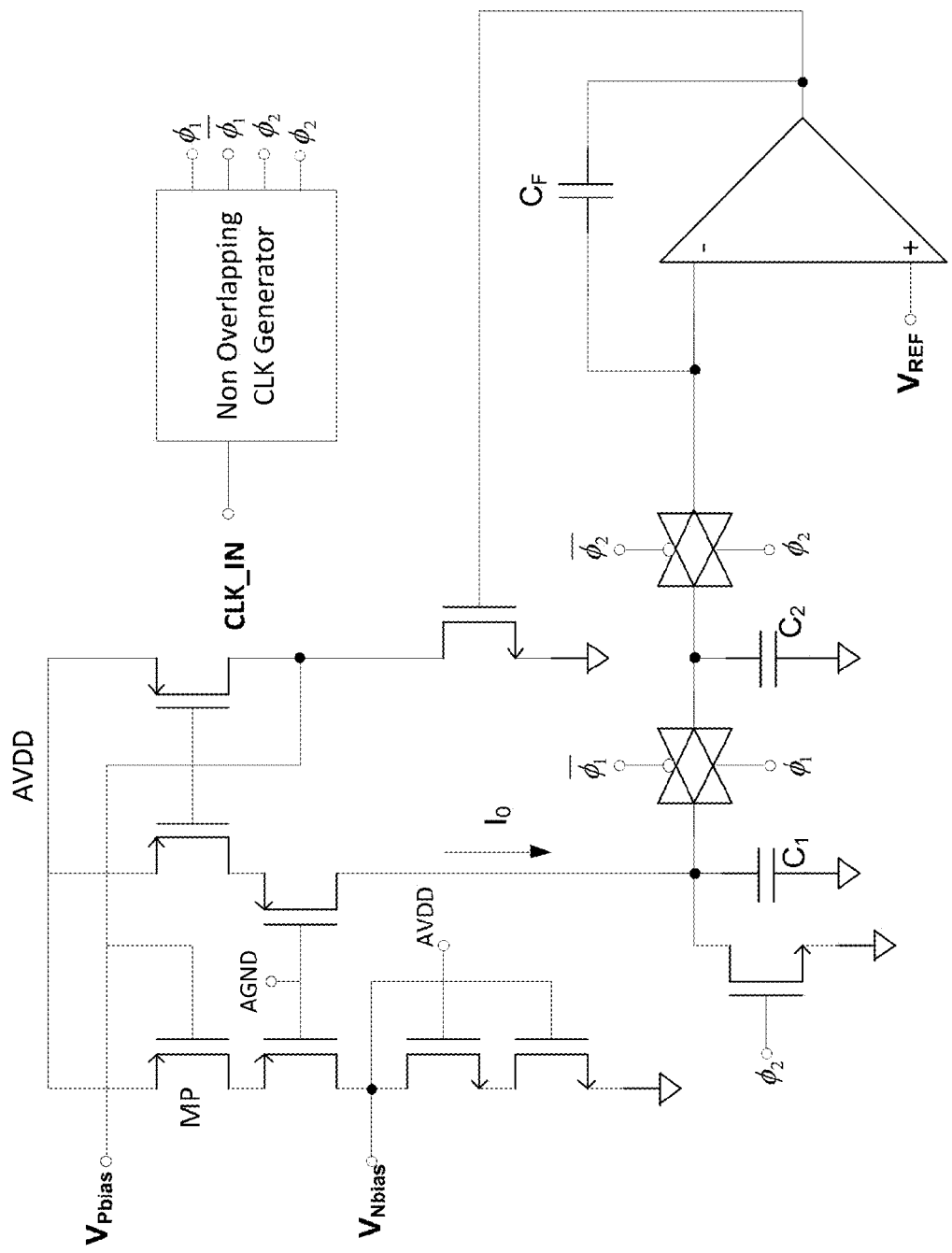
FIG. 32 illustrates a Delay Line Control Block.
Figure 33:
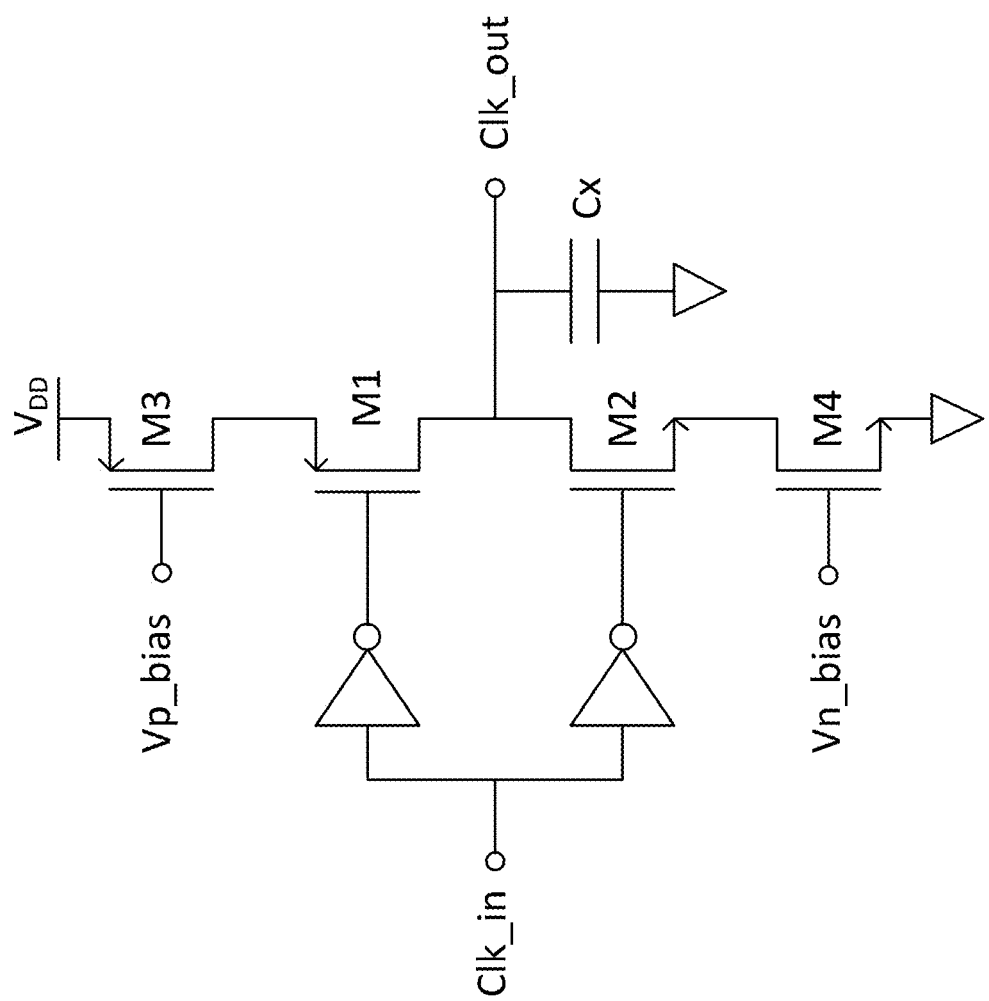
FIG. 33 illustrates a Delay Cell for delay Line.

The bias current level $I_x$ in the delay cells is controlled by the voltage levels $V_{Pbias}$ and $V_{Nbias}$. The delay of the rising or falling clock edge $$T_d = \frac{C_x \Delta V}{I_x}$$

through the delay cell (FIG. 33) is controlled by the time taken for the capacitor $C_x$ to be charged or discharged by the delay cell bias current, where $I_x=I_o/k$ and k is the ratio between devices MP FIG. 32 and M3 in FIG. 33.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A digital background calibration system for a successive approximation analog-to-digital converter comprising:
   a digital to analog converter (DAC) comprising a plurality of weighted capacitors to be calibrated;
   means for splitting each of said weighted capacitors into a plurality of sub-capacitors and at least one redundant capacitor;
   means for multiplying a voltage level of at least one of the sub-capacitors with a pseudo-random sequence; and
   means for calibrating the weighted capacitor comprising said at least one multiplied sub-capacitor and said at least one redundant capacitor.

2. The digital background calibration system as claimed in claim 1 wherein said means for calibrating produces output codes adapted to compensate for errors of the weighted capacitors.

3. The digital background calibration system as claimed in claim 1 wherein the DAC is adapted to receive an input from a pseudo-random generator circuit and a sub-capacitor selection circuit.

4. The digital background calibration system as claimed in claim 1 wherein the DAC is adapted to receive an input from a pseudo-random generator circuit and a sub-capacitor selection circuit and the pseudo-random generator circuit and the sub-capacitor selection circuit operate at a lower speed than the DAC.

5. The digital background calibration system as claimed in claim 1 wherein the DAC is adapted to receive an input from a pseudo-random generator circuit and a sub-capacitor selection circuit, and at a start of each conversion cycle one of the sub-capacitors $\Delta_{i,k}$ of the $i^{th}$ weighted capacitor is randomly selected from a signal obtained from the sub-capacitor selection circuit to be multiplied by the current value of the pseudo random sequence $q_{i,x}$ supplied from the pseudo-random generator circuit.

6. The digital background calibration system as claimed in claim 1 further comprising a voltage directly proportional to at least one sub-capacitor is added to an input voltage, and adapted to be converted to a digital value represented by $D(V_{IN}+q_{i,x}\cdot\Delta_{i,k})$.

7. The digital background calibration system as claimed in claim 1 further comprising a voltage directly proportional to at least one sub-capacitor is added to an input voltage, and adapted to be converted to a digital value represented by $D(V_{IN}+q_{i,x}\cdot\Delta_{i,k})$, the converted value is multiplied by the value to perform a correlation, and the output is adapted to be accumulated and averaged to obtain a DC value, represented by $D(\overline{\Delta_i})$.

8. The digital background calibration system as claimed in claim 7 further comprising means for subtracting the DC value from an expected value for the sub-capacitor $D(\Delta \exp_i)$ to provide an error value $\overline{\epsilon_i}$; and means for multiplying said error value by the plurality of sub-capacitors to obtain the value used for calibration.

9. The digital background calibration system as claimed in claim 7 further comprising means for subtracting $D(\overline{\Delta_i})\cdot q_{i,x}$ from the converted signal $D(V_{IN}+q_{i,x}\cdot\Delta_{i,k})$ to remove a perturbation signal from the output signal allowing conversion to occur during calibration.

10. The digital background calibration system as claimed in claim 1 wherein the DAC comprises at least one attenuation capacitor adapted to provide low values of capacitance during operation.

11. The digital background calibration system as claimed in claim 1 further comprising a trim capacitor adapted to compensate for gain error.

12. The digital background calibration system as claimed in claim 1 further comprising a trim capacitor adapted to compensate for gain error wherein the gain error determines the value of the trim capacitor applied on the right hand side of an attenuation capacitor to adjust the gain error.

13. The digital background calibration system as claimed in claim 1 further comprising a redundant capacitor adapted to compensate for loss in signal level by a pertubation process using one of the sub-capacitors on any given sampling instant.

14. The digital background calibration system as claimed in claim 1 further comprising means for increasing input signal range with a small increase in capacitor size such that any perturbations can be allowed to occupy this additional range, with $2^N-1$ codes available for the input signal as required and means for forcing the calibration of each weighted capacitor to occur sequentially, or in a sequence of parallel combinations, such that input range available to the signal is increased.

15. The digital background calibration system as claimed in claim 14 further comprising means for increasing the number of segments each weighted capacitor is split up into such that the size of the perturbation signal is reduced.

16. A method for digital background calibration of a successive approximation analog-to-digital converter comprising the steps of:
arranging a digital to analog converter (DAC) having a plurality of weighted capacitors to be calibrated;
splitting each of said weighted capacitors into a plurality of sub-capacitors and at least one redundant capacitor;
multiplying a voltage level of at least one of the sub-capacitors with a pseudo-random sequence; and
calibrating the weighted capacitor comprising said at least one sub-capacitor from said at least one sub-capacitor and said at least one redundant capacitor.

* * * * *